(12) United States Patent
Pei et al.

(10) Patent No.: US 8,237,324 B2
(45) Date of Patent: Aug. 7, 2012

(54) BISTABLE ELECTROACTIVE POLYMERS

(75) Inventors: Qibing Pei, Calabasas, CA (US); Zhibin Yu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 241 days.

(21) Appl. No.: 12/635,674

(22) Filed: Dec. 10, 2009

(65) Prior Publication Data
US 2010/0171393 A1    Jul. 8, 2010

Related U.S. Application Data

(60) Provisional application No. 61/121,506, filed on Dec. 10, 2008.

(51) Int. Cl.
*H02N 3/00* (2006.01)
*H01L 41/04* (2006.01)
(52) U.S. Cl. .................................... 310/306; 310/346
(58) Field of Classification Search .................. 310/306, 310/328, 346, 800
See application file for complete search history.

(56) References Cited

U.S. PATENT DOCUMENTS

| | | | |
|---|---|---|---|
| 5,356,500 A | 10/1994 | Scheinbeim et al. | |
| 6,545,384 B1 | 4/2003 | Perline et al. | |
| 6,664,718 B2 | 12/2003 | Perline et al. | |
| 6,781,284 B1 | 8/2004 | Perline et al. | |
| 6,812,624 B1 | 11/2004 | Pei et al. | |
| 6,876,135 B2 | 4/2005 | Perline et al. | |
| 6,911,764 B2 | 6/2005 | Perline et al. | |
| 7,209,280 B2 | 4/2007 | Goossens | |
| 7,233,907 B2 | 6/2007 | Young | |
| 7,320,457 B2 | 1/2008 | Heim et al. | |
| 7,378,783 B2 | 5/2008 | Perline et al. | |
| 7,411,331 B2 | 8/2008 | Dubowsky et al. | |
| 7,411,332 B2 | 8/2008 | Kornbluh et al. | |
| 7,436,099 B2 | 10/2008 | Pei et al. | |
| 2005/0200984 A1* | 9/2005 | Browne et al. | 359/846 |
| 2006/0038643 A1* | 2/2006 | Xu et al. | 335/78 |

OTHER PUBLICATIONS

Jacobsen, S.C. et al—"A Design Overview of an Eccentric-Motion Electrostatic Microactuator (the Wobble Motor:"—Sensors and Actuators, 20, 1989, pp. 1-16.
Heydt, Richard et al.—"Acoustical performance of an electrostrictive polymer film loudspeaker"—Journal of the Acoustical Society of America, vol. 109, Feb. 2000, pp. 833-839.
Kaneto, K. et al.—"Artificial Muscle: Electromechanical actuators using polyaniline films"—Synthetic Metals 71, pp. 2211-2212, 1995.
Kondoh, You et al.—"Bimorph Type Actuators Using Lead Zinc Niobate-Based Ceramics"—Japanese Journal of Applied physics, vol. 30, No. 9B, pp. 2260-2263, Sep. 1991.

(Continued)

*Primary Examiner* — Derek Rosenau
(74) *Attorney, Agent, or Firm* — John P. O'Banion

(57) ABSTRACT

A bistable electroactive polymer transducer is provided for electrically actuated deformation of rigid electroactive polymer members. The polymers have glass transition temperatures (Tg) above ambient conditions and turn into rubbery elastomers above Tg and have high dielectric breakdown strength in the rubbery state. They can be electrically deformed to various rigid shapes with maximum strain greater than 100% and as high as 400%. The actuation is made bistable by cooling below Tg to preserve the deformation. The dielectric actuation mechanism includes a pair of compliant electrodes in contact with a dielectric elastomer which deforms when a voltage bias is applied between the pair of electrodes. In some of the configurations, the dielectric elastomer is also a shape memory polymer. The deformations of such bistable electroactive polymers can be repeated rapidly for numerous cycles.

35 Claims, 13 Drawing Sheets

OTHER PUBLICATIONS

Lendlein, Andreas, et al.—"Biodegradable, Elastic Shape-Memory Polymers for Potential Biomedical Applications"—Science 296, pp. 1673-1676, 2002.

Smela, Elizabeth et al.—"Controlled Folding of Micrometer-Size Structures"—Science, vol. 268, pp. 1735-1738, Jun. 23, 1995.

Heydt, R. et al.—"Design and Performance of an Electrostrictive-Polymer-Film Acoustic Actuator"—Journal of Sound and Vibration, 1998, vol. 215, No. 2, pp. 297-311.

Smela, E. et al.—"Electrochemical Muscles: Micromachining Fingers and Corkscrews"—vol. 5, No. 9, pp. 630-632, Sep. 1993.

Furukawa, Takeo et al.—"Electrostriction as the Origin of Piezoelectricity in Ferroelectric Polymers"—Japanese Journal of Applied Physics, vol. 29, No. 4, pp. 675-680, Apr. 1990.

Martin, James E. et al.—"Electrostriction in field-structured composites: Basis for a fast artificial muscle?"—Journal of Chemical Physics, vol. 111, No. 9, pp. 4273-4280, Sep. 1, 1999.

Perline, Ronald E. et al.—"Electrostriction of polymer dielectrics with compliant electrodes as a means of actuation"—Sensors and Actuators A: Physical, vol. 64, 1998, pp. 77-85.

Ohara, K. et al.—"Electrostriction of polymethylmethacrylates"—Colloid & Polymer Science, vol. 280, pp. 164-168, 1982.

Elhami, K. et al.—Electrostriction of the copolymer of vinylidene-fluoride and trifluoroethylene—Journal of Applied Physics, vol. 77, No. 8, pp. 3987-3990, Apr. 15, 1995.

Zhang, Q.M. et al.—"Giant Electrostriction and Relaor Ferroelectric Behavior in Electron-Irradiated Poly(vinylidene-Fluoride-trifluoroethylene) Copolymer"—Science, vol. 280, pp. 2101-2104, Jun. 26, 1998.

Bharti, V. et al.—"High electrostrictive strain under high mechanical stress in electron-irradiated poly(vinylidene fluoride-trifluoroethylene) copolymer"—Applied Physics Letters, vol. 75, pp. 2653-2655, Oct. 25, 1999.

Zhenyi, MA et al.—"High Field Electrostrictive Response of Polymers"—Journal of polymer Sciences, Part B-Polymer Physics, vol. 32, pp. 2721-2731, 1994.

Perline, Ron et al.—"High-Speed Electrically Actuated Elastomers with Strain Greater Than %100"—Science, vol. 287, No. 5454, pp. 1-21, 2000.

Wade, William L. et al.—"Increased dielectric breakdown strengths of melt-extruded polypropylene films"—Polymer, vol. 34, No. 5, pp. 1093-1094, 1993.

Shkel, Yuri M. et al.—"Material parameters for electrostriction"—Journal of Applied Physics, vol. 80, No. 7, pp. 4566-4572, Oct. 15, 1996.

Anderson, R.A.—"Mechanical stress in a dielectric solid from a uniform electric field"—Physical Review B, vol. 33, No. 2, pp. 1302-1307, Jan. 15, 1986.

Pei, Qibing et al.—Multiple-degrees-of-freedom electroelastomer roll actuators—Smart Materials and Structures, vol. 13, pp. N86-N92, 2004.

Schlaberg, H.I. et al.—"Piezoelectric polymer composite arrays for ultrasonic medical imaging applications"—Sensors and Actuators A, vo. 44, pp. 111-117, 1994.

Bellin, I. et al.—"Polymeric triple-shape materials"—PNAS, vol. 103, No. 48, pp. 18043-18047, Nov. 28, 2006.

Kim,, Byung Kyu et al.—"Polyurethanes having shape memory effects"—Polymer, vol. 37, No. 26, pp. 5781-5793. 1996.

Koerner, Hilmar et al.—"Remotely actuated polymer nanocomposites: stress-recovery of carbon-nanotube-filled thermoplastic elastomers" Nature Materials, vol. 3, pp. 115-120, 2004.

Liu, C. et al.—Review of progress in shape-memory polymers—Journal of Materials Chemistry, vol. 17, pp. 1543-1558, 2007.

Kagami, Yoshiahru et al.—"Shape memory behaviors of corsslinked copolymers containing stearyl acrylate"—Macromol. Rapid Commun., vol. 17, pp. 539-543, 1996.

Behl, Marc et al.—"Shape-memory polymers"—Materials Today, vol. 10, No. 4, pp. 20-28, Apr. 2007.

Treloar, Leslie R. G.—"The Mechanics of Rubber Elasticity"—Journal of Polymer Science, Polymer Symposium No. 48, pp. 107-123, 1974.

Cheng, Z.-Y. et al.—"Transverse strain responses in electrostrictive poly(vinylidene fluoride-trifluoroethylene) films and development of a dilatometer for the measurement"—Journal of Applied Physics, vol. 86, No. 4, pp. 2208-2214, Aug. 15, 1999.

Park, Seung-Eek et al.—"Ultrahigh strain and piezoelectric behavior in relaxor based ferroelectric single crystals"—Journal of Applied Physics, vol. 82, No. 4, pp. 1804-1811, Aug. 15, 1997.

Shahinpoor, Mohsen—"Micro-Electro-Mechanics of Ionic Polymeric Gels as Eletrically Controllable Artificial Muscles."—Journal of Intelligent Material Systems and Structures, vol. 6, pp. 307-314, May 1995.

* cited by examiner

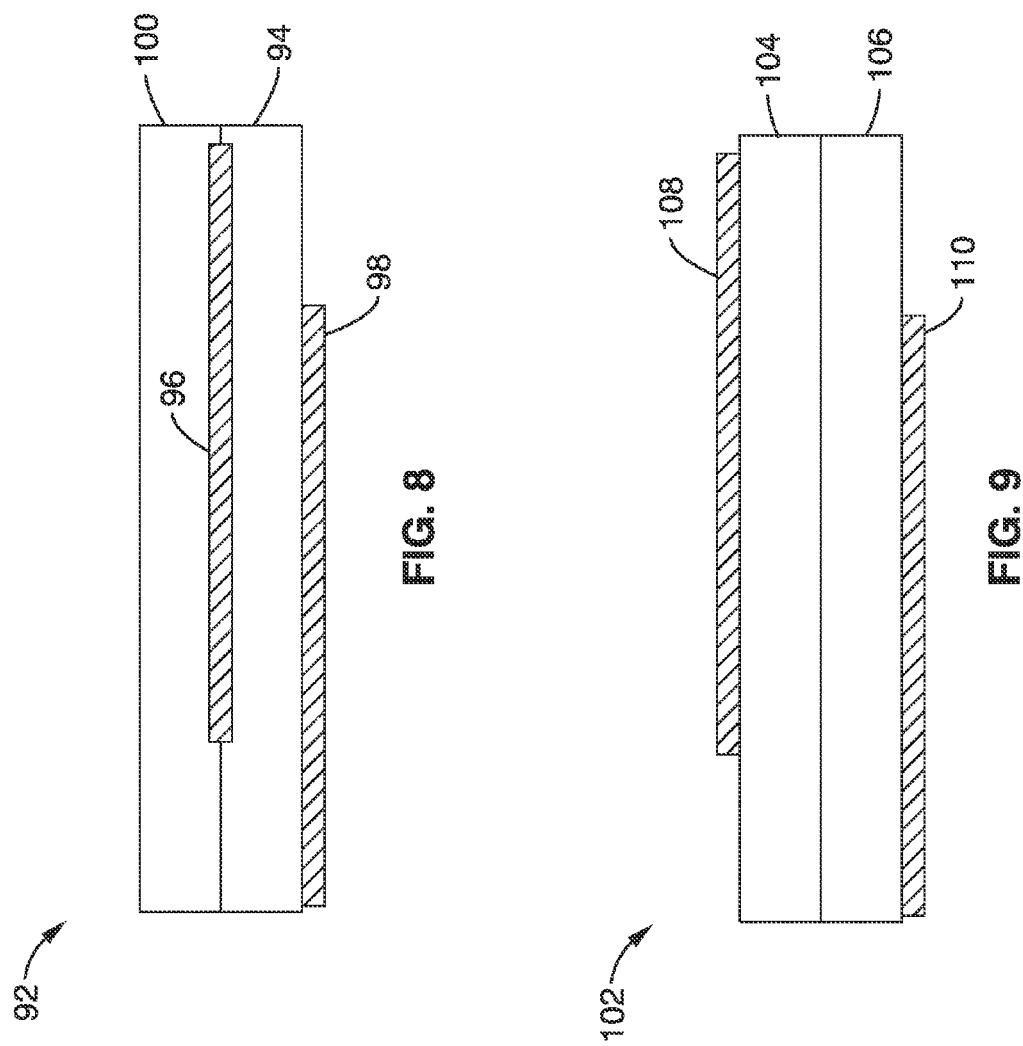

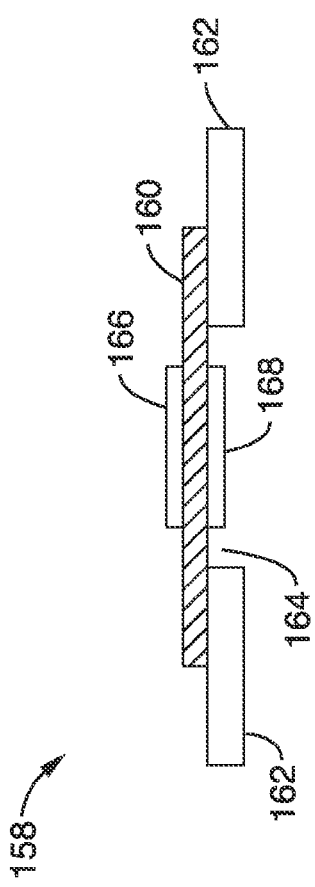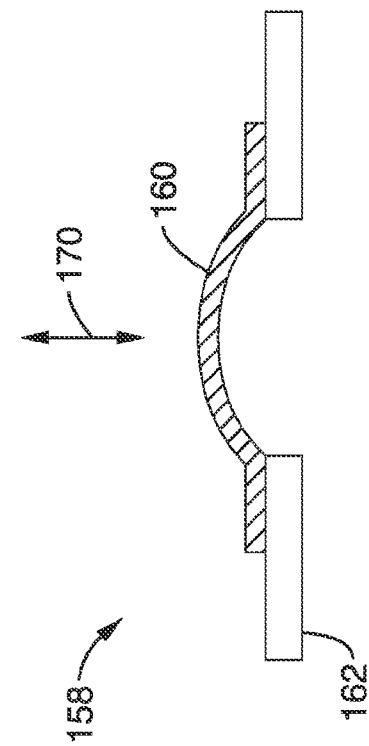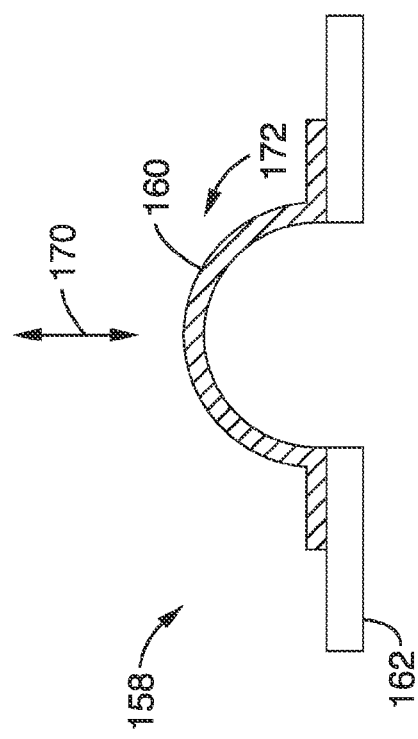

BISTABLE ELECTROACTIVE POLYMERS

CROSS-REFERENCE TO RELATED APPLICATIONS

This application claims priority from U.S. provisional application Ser. No. 61/121,506 filed on Dec. 10, 2008 and incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to electroactive polymers, and more particularly to a new category of electroactive polymers that are strong and can be deformed by electrical actuation. The actuation is bistable: the original or deformed shape of the polymer can be maintained until further actuation with the application of a temperature increase and an electric field. The deformation is reversible and can be repeated for numerous cycles.

2. Description of Related Art

Transducers are devices that are capable of converting energy from one form to another or from one system to another. Measurement or input transducers may use a wide range of physical, chemical, or biological effects to create an input variation in one energy form into corresponding variations in another energy form to provide an output. For example, a shape memory polymer is rigid at ambient temperature and rubbery and elastic above its glass transition temperature. A shape memory polymer is mechanically stretched, or "programmed", above a transition temperature when the polymer is rubbery. The temporarily deformed shape is retained when the temperature is cooled to below the transition point. In deployment, the deformed polymer is heated to above the glass transition temperature at which the polymer recovers its original shape. The requirement of programming is inconvenient for applications wherein multiple cycles of deformation-recovery are required. Furthermore, although a shape memory polymer may be made to restore more than one memorized shape, it cannot be used to obtain a larger number of or gradually-deformed shapes.

In other applications, it is desirable to convert between electrical and mechanical energy. Common examples of applications requiring translation from electrical to mechanical energy include robotics, pumps, valves, general automation, prosthetic devices, orthopedic devices, surgical tools, automotive controls, microelectromechanical systems, adaptive structures, adaptive surfaces, implanted medical devices, optical switches, and adaptive lenses.

Electroactive Polymers or EAP's are polymers whose shape can be modified with an applied voltage to transduce electrical energy into mechanical motion. Some EAP's are characterized by being able to make significant deformation while maintaining large forces.

There are generally two recognized classes of EAP's: dielectric elastomers and Ionic EAP's. Dielectric elastomers, exhibit reversible large actuation strains when a high electric field is applied across a thin film of the polymer. Actuation is achieved by electrostatic forces that squeeze the polymer between two electrodes. However, many electric actuator technologies such as electromagnetic motors and solenoids are not suitable for applications where the required device size is small (e.g., micro or mesoscale machines).

The dielectric elastomers are gel-like soft polymers. In order to generate a large Maxwell strain, a low elastic modulus is required, often less than 10 MPa. As such, the dielectric elastomers lack sufficient mechanical stiffness to undertake a large external load. The actuation of a dielectric elastomer is not bistable. Accordingly, when the driving voltage is removed the polymer returns to its original shape. The lack of bistability can reduce the operation lifetime, particularly for situations wherein the polymers need to maintain the deformed shape for a relatively long period of time.

There are other EAP's such as polyvinylidene difluoride (PVDF) and various copolymers of PVDF that are fairly rigid. Their actuated strain, however, is small, generally less than 10%, and the actuation they are not bistable.

Generally EAP's lack the stiffness required for the structural functions that most synthetic polymers are known for. In addition, the actuation of dielectric elastomers is not bistable: the high electric field has to be maintained in order to preserve the actuated deformation. The lack of bistability makes the dielectric elastomers less suitable for long duty cycle or open loop applications wherein the actuated shape needs to be maintained for an extended period of time. In such occasions, the current leakage at high strains can severely reduce the operation lifetime of the dielectric elastomer actuators.

Accordingly, there is a need for materials and devices that can convert between electrical and mechanical energy with large and bistable actuation. The present invention recognizes and satisfies a need for new electroactive polymers that convert between electrical and mechanical energy that has bistable actuation and is generally an improvement over the art.

BRIEF SUMMARY OF THE INVENTION

By way of example, and not of limitation, a preferred embodiment of the invention is a transducer with a shape memory polymer and a dielectrically induced actuation mechanism for bistable actuation. The dielectric actuation mechanism includes electrodes contacting a dielectric polymer. The shape memory polymer is normally a relatively rigid material at an ambient temperature and turns into a rubbery elastomer above the polymer's glass transition temperature. Upon cooling down, the polymer recovers its rigidity.

The dielectric polymer may also be the shape memory polymer. This dual functional polymer is termed "bistable electroactive polymer." The polymer may also be a soft elastic polymer other than the shape memory polymer.

When the shape memory polymer is heated to above a transition temperature (Tg), a voltage is applied to the electrodes to cause deformation of the bistable electroactive polymer or the shape memory polymer. The deformation is retained after the temperature is allowed to decrease below the Tg and the voltage is removed. The deformed polymer(s) recover its (their) original shape when the shape memory polymer is heated to above its Tg. An intermediate shape is obtained when an appropriate voltage is applied during heating of the shape memory polymer. Some polymers of the present invention include additives that improve conversion from electrical to mechanical energy and/or improve the mechanical property of the polymers. Other polymers of the present invention include laminate layers that improve conversion from electrical to mechanical energy and/or the stability of the deformed shape.

The compliant electrodes of the present invention may be comprised of nanoparticles, nanotubes, nanowires, or a mixture thereof, made of a conductive material such graphite, grapheme, single wall carbon nanotube, few wall carbon nanotube, multiwall carbon nanotube, a conducting polymer such as polypyrrole, polyaniline, polythiophene, poly(3-methylthiophene), poly(3,4-ethylenedioxythiophene), a metal such as silver, copper, aluminum, gold, nickel, stainless steel, a ceramic conductor such as indium doped tin oxide, or a mixture thereof or other suitable conductive materials. One embodiment of the present invention includes compliant electrodes that are transparent or translucent. Another embodiment of the present invention includes transparent or translucent electrodes comprised of ultrathin coating of carbon nanotubes. A further preferred embodiment of the compliant electrodes is comprised of an ultrathin coating of single wall carbon nanotubes and/or carbon-based nanoparticles with a coating thickness in the range of 20 to 100 nm.

According to one embodiment of the invention, a bistable electroactive polymer, or dielectric shape memory polymer, with a high dielectric breakdown strength in the heated rubbery state is provided. Compliant electrodes that conform to the changing shape of the shape memory polymer are capable of electrical communication at the high strains encountered when a high voltage is applied such that the electric field is smaller than the dielectric breakdown strength of the polymer are preferred.

In another embodiment of the present invention a shape memory polymer and a dielectric elastomer with high dielectric breakdown strength is provided. Compliant electrodes that conform to the changing shape of the dielectric elastomer are capable of electrical communication at the high strains encountered when a high voltage is applied. A preferred embodiment of the invention includes a laminate having at least one layer of a shape memory polymer and a layer of a dielectric elastomer.

In yet another aspect of the invention a thermoplastic shape memory polymer and annealing of a polymer are provided. In one embodiment, the polymer is annealed while pre-strained. In another embodiment, the annealing locks a fraction up to 99% of the pre-strain. In yet another embodiment, the thermoplastic polymer is poly(t-butylacrylate).

In still another embodiment, a complaint electrode that conforms to the changing shape of the shape memory polymer and is capable of electrical communication at the high strains encountered by the shape memory polymer is provided. An electric current is applied through the electrode to cause resistive heating and the temperature increase of the shape memory polymer.

According to another aspect of the invention, a shape memory polymer containing one or more conductive fillers is used. An electric current is applied through the shape memory composite to cause a temperature increase of the composite. In one embodiment of the invention, the conductive filler is selected from group of fillers including conductive nanoparticles, conductive nanotubes, conducting nanowires, and conducting polymers.

In another aspect of the invention a shape memory polymer including additives selected from the group of additives including light absorbing agents, light absorbing fillers, microwave absorbing fillers, infrared light absorbing fillers, and infrared light absorbing agents are used. An external stimulus is applied via the additives to raise the temperature of the shape memory composite.

The present invention also provides to a shape memory polymer that is pre-strained to improve the mechanical response of the polymer, in one embodiment. The pre-strain may vary in different directions of the polymer to vary response of the polymer to an applied voltage. In another embodiment, a laminate is provided consisting of a shape memory polymer and a dielectric elastomer. One or more of the polymers is pre-strained to improve the mechanical response of the laminate. The pre-strain may vary in different directions of the laminate to vary response of the laminate to an applied voltage.

In one aspect, the present invention provides methods for fabricating electromechanical devices including at least a shape memory polymer. The shape memory polymer is pre-strained by one of a number of techniques such as mechanically stretching a polymer and fixing the polymer to one or more solid members while it is stretched. One embodiment of the present invention includes a pre-strain of the shape memory polymer caused by one or more of a spring in compression, a pneumatic pressure, a hydraulic pressure, and a foam in compression.

In another aspect, the present invention provides methods for fabricating electromechanical devices including at least a shape memory polymer. The shape memory polymer is pre-shaped to have a curved surface in portions of the polymer. One embodiment of the fabrication process includes embossing the shape memory polymer to obtain the curved shape in portions of the polymer. Another embodiment of present invention includes the conforming of a polymer to an uneven surface of a substrate. In a preferred embodiment, a layer of an electroactive polymer is conformed to a substrate that has an array of raised dots on the surface. In a further preferred embodiment, the electroactive polymer conformed on a substrate is actuated such that the portions of the polymer on the raised dots on the substrate deform in the direction normal to substrate surface.

Polymers of the present invention may be made by casting, dipping, spin coating, spraying, printing, hot pressing, or other known processes for fabrication of thin polymer layers.

The transducer may include at least two electrodes and a shape memory polymer arranged in a manner which causes a portion of the polymer to deform in response to a change in electric field. In one embodiment, the electrodes conform to the shape memory polymer, and the electric field in the shape memory polymer is changed to cause the deformation of the polymer.

In another embodiment, the electrodes conform to a polymer other than the shape memory polymer, and the electric field in this second polymer is changed to cause the deformation of the transducer.

In another embodiment, the transducer includes at least two electrodes and a shape memory polymer that has a wavelike or corrugated surface. In one embodiment, at least two electrodes conform to the corrugated surface. In a preferred embodiment, at least two electrodes are made of a metal or alloy. These corrugated embodiments can be made into laminates of several layers.

The transducer may include at least two electrodes and a shape memory polymer arranged in a manner which causes a portion of the polymer to deform in response to a change in electric field provided by the least two electrodes. The portion of the polymer deforms with a maximum linear strain between 5% and 300% in response to the change in electric field. In another embodiment, one or more of the electrodes conform to the shape memory polymer to cause a temperature increase when an electrical current is applied through an electrode.

In another embodiment of the present invention, an actuator for converting electrical energy into displacement in a first direction is provided. The actuator comprises at least one transducer. Each transducer comprises at least two electrodes and a shape memory polymer arranged in a manner which causes a portion of the polymer to deform in response to a change in electric field. The actuator also comprises at least one stiff member coupled to the at least one transducer, the at least one stiff member substantially preventing displacement in a second direction.

In yet another embodiment, an actuator having a transducer with a shape memory polymer arranged in a manner which causes a first portion of the polymer to deform in response to a change in electric field, a first electrode pair configured to actuate a second portion of the polymer and a second electrode pair configured to actuate a third portion of the polymer, the actuator also having an output member coupled to a first portion of the polymer is provided.

The present invention also relates to a transducer for translating from electrical to mechanical energy that includes at least two electrodes and a shape memory polymer that is coupled with an optical grating. In a preferred embodiment, the optical grating is made of a soft elastomer and laminated with a portion of an electroactive polymer.

The present invention may also include heating elements for raising the temperature of the polymer including resistance heating elements, a radiation source and radiation absorbing film, a light source and a polymer colorant and patterned laser light.

One embodiment of the transducer has a plurality of rigid elements joined to the polymer elements such that the position of rigid elements is changed with the deformation of polymer by the electric fields. These rigid elements may also be configured into arrays.

The transducer of the present invention can be adapted to many different uses such as with robotics, a motor, a pump, a toy, an actuator, a generator, a sensor, a medical implant or prosthetic device, a solar cell positioning system, a Braille display, an electrically tunable diffraction grating, unimorph and bimorph applications and the like.

A transducer is provided, wherein the deformation of the polymer is retained or partially retained when the temperature is allowed to cool below a transition temperature or the retained deformation is caused to change when the temperature is caused to rise above a transition temperature Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 8 illustrates a schematic cross sectional view of a transducer consisting of a dielectric elastomer and a shape memory polymer conforming to each other in accordance with one embodiment of the present invention.

FIG. 9 is a schematic cross-sectional view of a transducer consisting of a dielectric elastomer and a shape memory polymer conforming to each other in accordance with an alternative embodiment of the present invention.

FIG. 14 is a schematic cross-sectional side view of a diaphragm actuator including a bistable electroactive polymer before application of a voltage in accordance with one embodiment of the present invention.

FIG. 15 illustrates a schematic cross-sectional view of the bistable electroactive polymer diaphragm of FIG. 14 after application of a voltage.

FIG. 16 illustrates a cross-sectional view of the bistable electroactive polymer diaphragm of FIG. 15 with pre-deflection of the polymer formed in fabrication.

FIG. 19B illustrates one raised diaphragm of the diaphragm array in

Figure 19A:
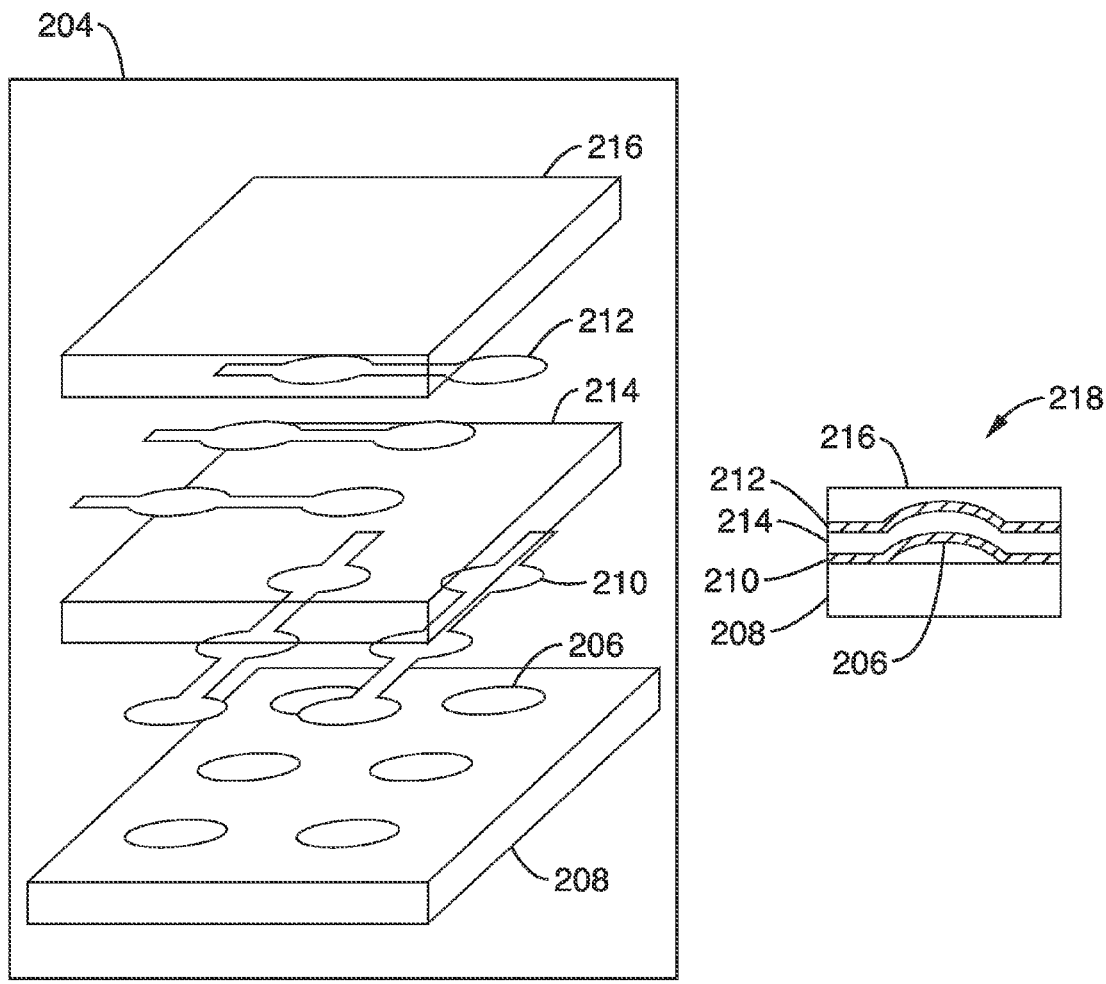
FIG. 19A illustrates a composite and expanded view of a schematic array of 2×3 diaphragms including a shape memory polymer, a dielectric elastomer, and a substrate with raised height on portions of the substrate surface in accordance with another embodiment of the present invention.

FIG. 19A after the application of a voltage.

Figure 20:
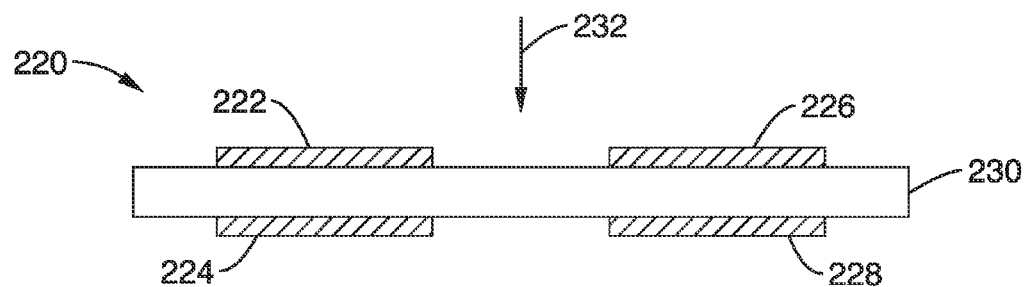

FIG. 20 illustrates a schematic cross-sectional side view of a transducer including a bistable electroactive polymer having a portion of the polymer with variable optical transmission in accordance with one embodiment of the present invention.

Figure 21:
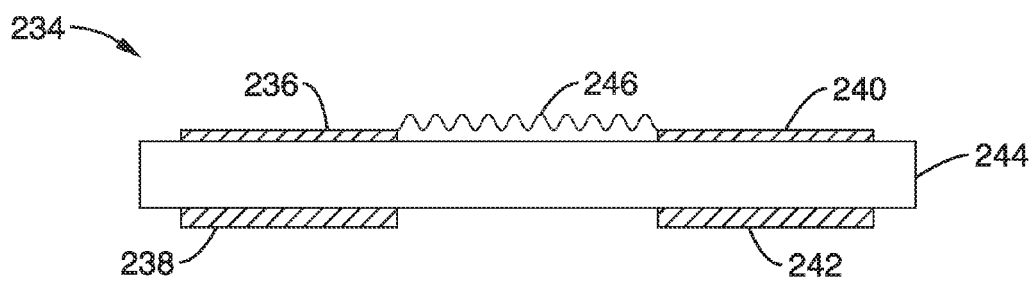

FIG. 21 illustrates a schematic cross-sectional side view of a transducer including a bistable electroactive polymer and an optical diffraction grating in accordance with one embodiment of the present invention.

Figure 22:
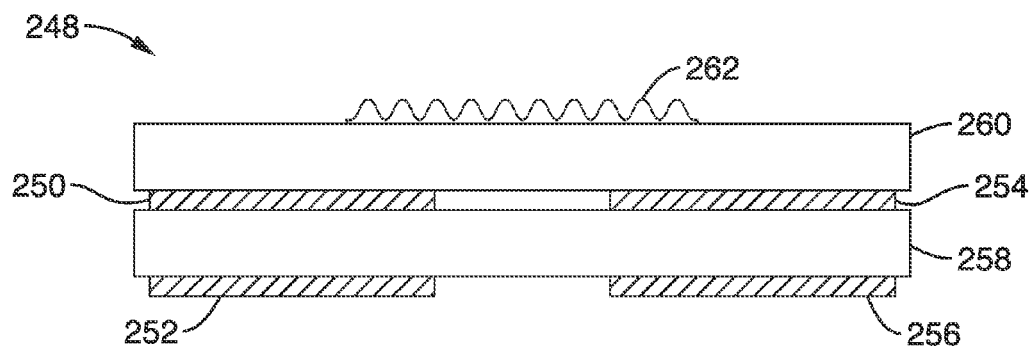

FIG. 22 illustrates a schematic cross-sectional side view of a transducer including a shape memory polymer, a dielectric elastomer, and an optical diffraction grating in accordance with another embodiment of the present invention.

DETAILED DESCRIPTION OF THE INVENTION

Referring more specifically to the drawings, for illustrative purposes the present invention is embodied in the apparatus generally shown in FIG. 1 through FIG. 22. It will be appreciated that the apparatus may vary as to configuration and as to details of the parts, and that the methods may vary as to the specific steps and sequence, without departing from the basic concepts as disclosed herein.

Figure 1A:
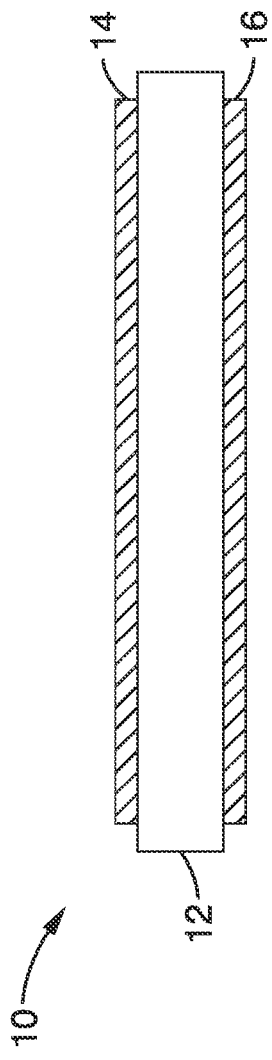
FIG. 1A is a schematic cross sectional view of a transducer before the application of a voltage in accordance with one embodiment of the present invention.
Figure 1B:
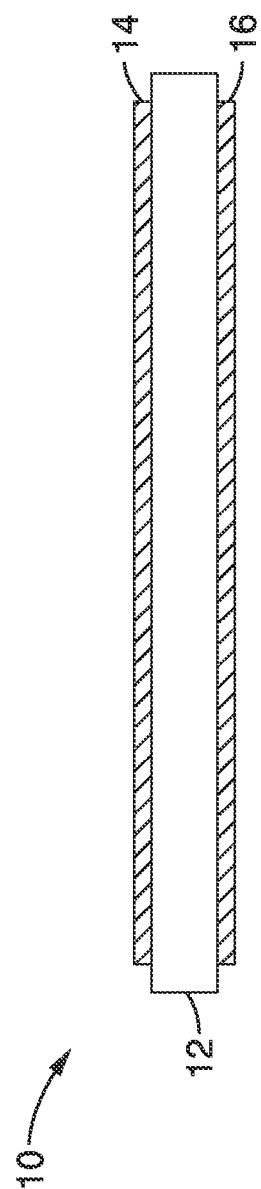
FIG. 1B is a schematic cross sectional view of a transducer and after application of a voltage in accordance with one embodiment of the present invention shown in FIG. 1A.
Figure 1C:
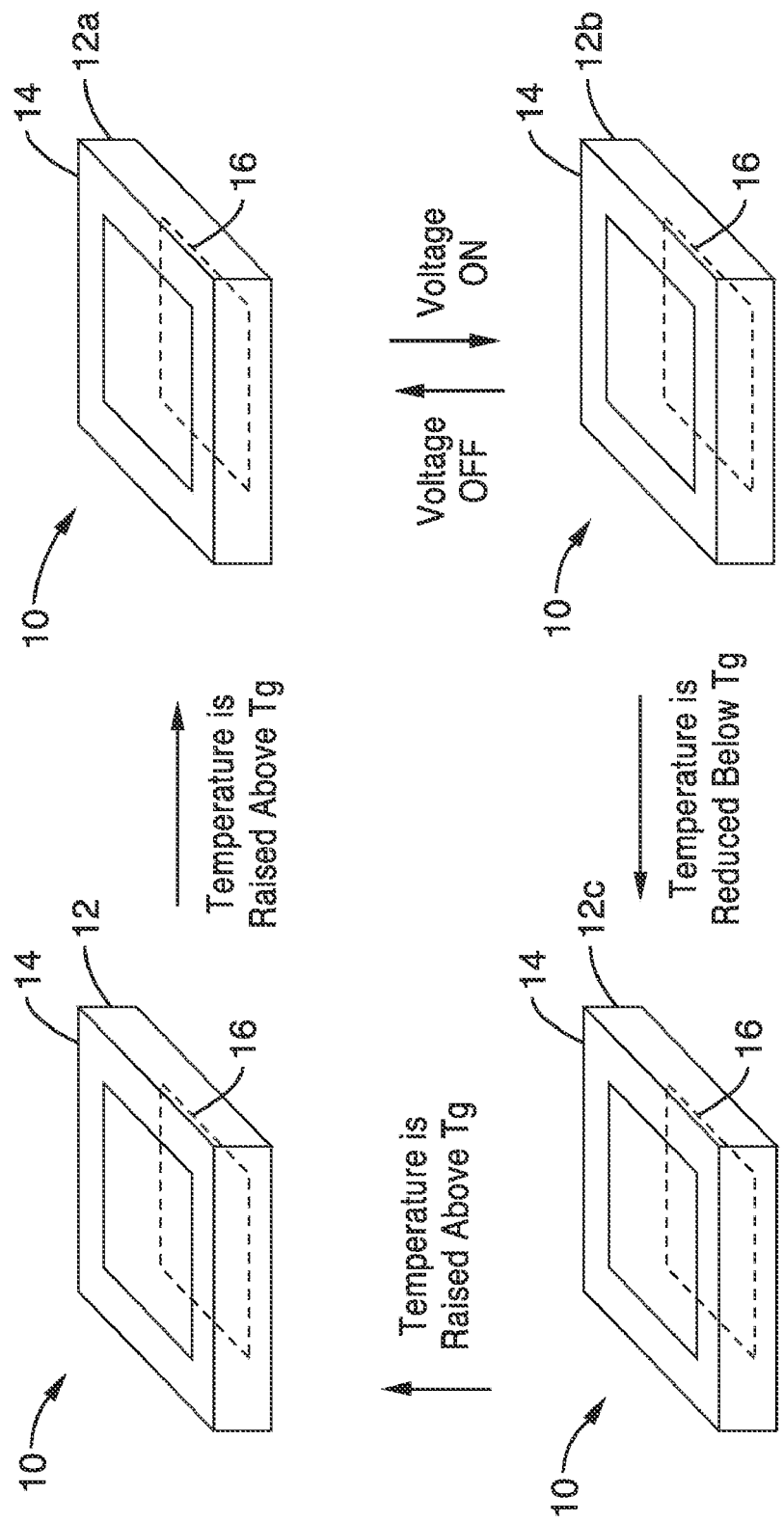
FIG. 1C illustrates a cycle of actuation involving temperature and voltage in accordance with one embodiment of the present invention.

Turning now to FIG. 1A to FIG. 1C, a transducer 10 with at least one bistable electroactive polymer 12 in contact with top electrode 14 and bottom electrode 16 is used to illustrate the invention. Electroactive polymers deform when actuated by electrical energy. FIG. 1A illustrates the transducer 10 before the application of a voltage and FIG. 1B illustrates the transducer 10 after the application of a voltage.

In one embodiment, an electroactive polymer 12 refers to a polymer that acts as an insulating dielectric between two electrodes, may deform upon application of a voltage difference between the two electrodes, and the deformation may be dramatically modified with a temperature change across the glass transition of the polymer. In another preferred embodiment, an electroactive polymer 12 behaves as a shape memory polymer, i.e., it is relatively rigid at temperatures below its glass transition and behaves like a rubber in a temperature range above the glass transition temperature. The electroactive shape memory polymer 12 is termed "bistable electroactive polymer." The deformation of the polymer below its glass transition temperature Tg, defined by a linear strain of the polymer thickness or area strain, is small, even when a relatively high voltage is applied. Above the Tg, the same high voltage may induce a large area strain. The area strain, defined as the percentage change of the area of a polymer film across which the applied voltage generates a high electric field, is determined by the applied voltage. Voltage, therefore, may be used to obtain various strains. The large strain is retained when the applied voltage is moved after the polymer has been cooled to below the Tg. The strained polymer relaxes when it is heated to above the Tg. The original shape of the polymer may be recovered after the polymer is heated the Tg for a sufficient duration of time. Accordingly, the present invention related to actuated deformation of a polymer between two stable rigid shapes.

In another embodiment, polymers 12 are pre-strained to improve conversion between electrical and mechanical energy. The pre-strain improves the mechanical response of an electroactive polymer relative to a non-strained electroactive polymer. The improved mechanical response enables greater mechanical work for an electroactive polymer, e.g., larger deformation and actuation pressures. Combining directional variability of the pre-strain, different ways to constrain a polymer, scalability of electroactive polymers to both micro and macro levels, and different polymer orientations (e.g., rolling or stacking individual polymer layers) permits a broad range of actuators that convert electrical energy into mechanical work. These actuators find use in a wide range of applications.

The combination of shape memory and large-strain actuation of the present invention may also be obtained with at least two different polymers: a shape memory polymer, and an electroactive polymer. In another embodiment, a transducer consisting of at least a shape memory polymer and an electroactive polymer is used. One embodiment is a laminate of the at least two polymers. In one preferred embodiment, the electroactive polymer 12 is a dielectric elastomer, and a soft elastomer with relatively high dielectric breakdown strength.

As the electroactive polymers of the present invention may deform at linear strains of at least about 100 percent, electrodes 14, 16 attached to the polymers 12 should preferably also deform without compromising mechanical or electrical performance. Compliant electrodes that conform to the shape of an electroactive polymer they are attached to are preferred. The electrodes are capable of maintaining electrical communication even at the high deformations encountered with polymers of the present invention. By way of example, strains of at least about 50 percent are common with electrodes of the present invention. In some embodiments, compliance provided by the electrodes may vary with direction.

As the polymers are suitable for use in both the micro, meso, and macro scales, in a wide variety of actuators and in a broad range of applications, fabrication processes used with the present invention vary greatly. In another aspect, the present invention provides methods for fabricating electromechanical devices including one or more polymer.

Referring specifically to FIGS. 1A and 1B, a transducer 10 includes a bistable electroactive polymer 12 for translating between electrical energy and mechanical energy. Top and bottom electrodes 14 and 16 are attached to the electroactive polymer 12 on its top and bottom surfaces respectively to provide a voltage difference across a portion of the polymer 12. The polymer 12 deforms with a change in electric field provided by the top and bottom electrodes 14 and 16. Deformation of the transducer 100 in response to a change in electric field provided by the electrodes 104 and 106 is referred to as actuation. As the polymer 102 changes in size, the deformation may be used to produce mechanical work.

FIG. 1B is a cross-sectional view of the transducer 10 including deformation in response to a change in electric field. Generally speaking, deformation refers to any displacement, expansion, contraction, torsion, linear or area strain, or any other deflection of a portion of the polymer 12. The change in electric field corresponding to the voltage difference produced by the electrodes 14 and 16 produces mechanical pressure within the polymer 12. Polymer 12 may also be pre-strained. In this case, the unlike electrical charges produced by the electrodes 14 and 16 are attracted to each other and provide a compressive force between the electrodes 14 and 16 and an expansion force on the polymer 12 in planar directions, causing the polymer 12 to compress between the electrodes 14 and 16 and stretch in the planar directions.

In some cases, the electrodes 14 and 16 may cover a limited portion of the polymer 12 relative to the total area of the polymer. This may be done to prevent electrical breakdown around the edge of polymer 12 or achieve customized deformations in certain portions of the polymer. As the term is used herein, an active region is defined as a portion of the polymer material 12 having sufficient electrostatic force to enable deformation of the portion of polymer 12. As will be described below, a polymer of the present invention may have multiple active regions. Polymer 12 material outside an active area may act as an external spring force on the active area during deformation. More specifically, material outside the active area may resist active area deformation by its contraction or expansion. Removal of the voltage difference and the induced charge causes the reverse effects.

The electrodes 14 and 16 are preferably compliant and change shape with the changes of polymer 12. The configuration of the polymer 12 and the electrodes 14 and 16 provides for increasing polymer 12 response with deformation. More specifically, as the transducer 10 deforms, compression of the polymer 12 brings the opposite charges of the electrodes 14 and 16 closer and stretching of the polymer 12 separates similar charges in each electrode. In one embodiment, one of the electrodes 14 and 16 is a ground electrode.

Generally speaking, the transducer 10 continues to deform until mechanical forces balance the electrostatic forces driving the deformation. The mechanical forces include elastic restoring forces of the polymer 12 material, the compliance of the electrodes 14 and 16, and any external resistance provided by a device and/or load coupled to the transducer 10. The resultant deformation of the transducer 10 as a result of the applied voltage may also depend on a number of other factors such as the polymer 12 dielectric constant and the polymer 12 size.

A bistable electroactive polymer 12 in accordance with the present invention is relatively rigid at a temperature below the polymer's glass temperature Tg. The polymer becomes a soft elastomer, or rubber, in a certain temperature range above Tg. As a rubber, the polymer may be deformed by at least 100% in a linear direction or in area increase. When the driving force that causes the rubber polymer 12 to deform is removed, the rubber recovers its original shape. However, if the rubber polymer is cooled to below Tg while the driving force is kept on, the rubber polymer 12 becomes rigid. The cooled polymer 12 retains its deformation after the driving force is removed. This rubbery-to-rigid transition may be used to control the strain of the electroactive polymer of the present invention. Below Tg, when a voltage is applied between the electrodes 14 and 16, the electroactive polymer 12 may not significantly increase in size in any planar directions. However, above Tg, when a voltage is applied between the electrodes 14 and 16, the electroactive polymer 12 increases in size in at least one planar direction and decreases in size in the orthogonal direction. Accordingly, the deformation of an electroactive polymer may be controlled with temperature and/or applied voltage.

FIG. 1C illustrates a cycle of deformation involving temperature and voltage application. The electroactive polymer 12 of a transducer 10 is heated to above Tg. The polymer 12 becomes rubbery 12a. A voltage is applied between the electrodes 14 and 16, the electroactive polymer 12a increases in planar area and decreases in thickness. The deformed polymer 12b remains rubbery. Deformed polymer 12b can be cooled to below the Tg and it becomes rigid again, 12c, similar to the polymer 12, though with large deformation. This deformation is retained when the applied voltage is removed. Polymer 12c is returned to the original shape and size, 12, via a cycle of heating above Tg followed by cooling to below Tg.

The electroactive polymer 12 may also be pre-strained. The pre-strain may improve conversion between electrical and mechanical energy. In one embodiment, pre-strain improves the dielectric strength of the polymer. For the transducer 10, the pre-strain allows the electroactive polymer 12 to deform more and provide greater mechanical work. Pre-strain of a polymer may be described in one or more directions as the change in dimension in that direction after pre-straining relative to the dimension in that direction before pre-straining. The pre-strain may comprise elastic deformation of the polymer 12 at above its Tg, and be formed, for example, by stretching the polymer in tension and fixing one or more of the edges while stretched. The pre-strain may be imposed at the boundaries using a rigid frame or may be implemented locally for a portion of the polymer. In another embodiment, pre-strain may comprise elastic deformation of the polymer 12 at above its Tg, and be formed, for example, by stretching the polymer in tension and cooling to below Tg while stretched. The cooling preserves much of the pre-strain after the stretching force is removed. In yet another embodiment, pre-strain may comprise deformation of the polymer 12 at above its Tg and annealing, for example, by stretching the polymer in tension, annealing for an elapsed time while stretched, and cooling to below Tg.

In one embodiment, pre-strain is applied uniformly over a portion of the polymer 12 to produce an isotropic pre-strained polymer. By way of example, poly(t-butylacrylate) may be heated and stretched by 100-300 percent in both planar directions. A stretched film is annealed at 80° C. for several hours or longer and then cooled to ambient condition. The annealed film retains much of the pre-strain. In another embodiment, pre-strain is applied unequally in different directions for a portion of the polymer 12 to produce an anisotropic pre-strained polymer. In this case, the polymer 12 may deform greater in one direction than in the another when it is actuated.

Linear strain and area strain may also be used to describe the deformation of a pre-strained polymer 12. As the term is used herein, linear strain of a pre-strained polymer refers to the deformation per unit length along a line of deformation relative to the non-actuated state. Maximum linear strains (tensile or compressive) of at least about 50 percent are common for polymers of the present invention. Of course, a polymer may deform with a strain less than the maximum, and the strain may be adjusted by adjusting the applied voltage. Area strain of an electroactive polymer refers to the change in planar area, e.g. the change in the plane of the polymer film, per unit area of the polymer upon actuation relative to the non-actuated state. Maximum area strains of at least about 100 percent are possible for polymers of the present invention.

Transducers 10 and polymers of the present invention are not limited to any particular geometry or linear deformation. For example, the polymer and electrodes may be formed into any geometry or shape including tubes and rolls, polymers attached between multiple rigid structures, polymers attached across a frame of any geometry—including curved or complex geometries, across a frame having one or more joints, etc. Deformation of a transducer according to the present invention includes linear expansion and compression in one or more directions, bending, axial deformation when the polymer is rolled, deformation out of a hole provided in a substrate, etc. Deformation of a transducer may be affected by how the polymer is constrained by a frame or rigid structures attached to the polymer.

Materials used as an electroactive polymer 12 may be selected based on one or more material properties such as a relatively high mechanical stiffness below Tg, a high electrical breakdown strength and a low modulus of elasticity for large or small deformations above Tg, a high dielectric constant, etc. In one embodiment, the polymer is selected such that it has an elastic modulus above 100 MPa at below Tg and below 10 MPa at above Tg. By way of example, poly(t-butylacrylate) synthesized by photo-initiated free-radical polymerization, cast into films, pre-strained and annealed at 70° C. for 12 hours was measured to have a storage modulus of 1.5 GPa at 20° C. and 0.42 MPa at 70° C. The measured Tg is around 45° C. At ambient temperature, a 1.8 kV voltage applied across a prestrained and annealed poly(t-butylacrylate) film with 30 micrometer thickness did not produce any observable deformation. When the film was heated to 70° C., a 1.8 kV applied produced a maximum area strain of 335%. The calculated maximum electric field is 260 V/micrometer. The dielectric constant of the PTBA was measured to be 5.4 at 70° C. at 200 Hz. Thus, the calculated maximum actuation stress is 3.2 MPa. The actuation was bistable: the deformed polymer retained the large strain after the polymer was cooled to 25° C. and the applied voltage was removed. The actuation strain at above Tg was dependent on the applied voltage: the polymer may be deformed to various shapes between the relaxed shape and maximum strain.

A narrow glass transition temperature range is generally desirable for a bistable electroactive polymer 12. However, different applications may require different Tg for the polymer 12. For example, for an application for a refreshable Braille display, the Tg is preferably above a normal human body temperature, above 37° C. and below 80° C. For some applications, an electroactive polymer is selected based on one or more application demands such as a wide temperature and/or humidity range, repeatability, accuracy, low creep, reliability and endurance.

Suitable actuation voltages for polymers 12 of the present invention may also vary based on the electroactive polymer material and its properties (e.g. the dielectric constant) as well as the dimensions of the polymer (e.g. the thickness between electrodes). By way of example, actuation electric fields for the polymer 12 in FIG. 1A may range in magnitude from about 0 V/m to 440 MegaVolts/meter. Actuation voltages in this range may produce a pressure in the range of about 0 Pa to about 10 MPa. To achieve a transducer capable of higher forces, the thickness of the polymer may be increased. Alternatively, multiple polymer layers may also be implemented.

Figure 2:
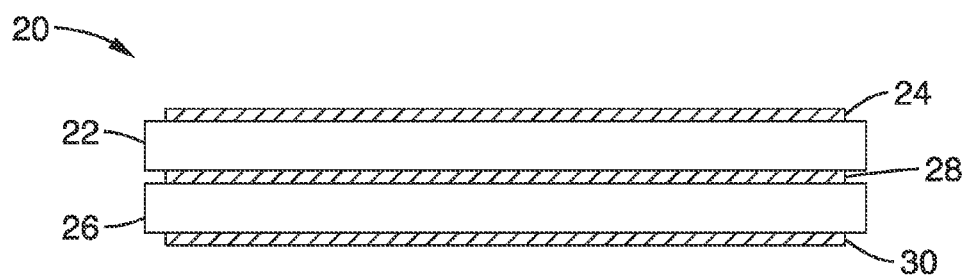
FIG. 2 illustrates a schematic cross sectional view of a transducer consisting of two stacked bistable elctroactive polymers according to the invention.

Referring now to FIG. 2, a transducer 20 consisting of two polymer layers (22 and 26) and three electrode layers (24, 28, and 30) is illustrated. In one embodiment, electrode 28 is formed as a single coating on 26 or 22 before the polymer layers are stacked. In another embodiment, electrode 28 is made up of two coatings respectively formed on the surface of polymer 22 and polymer 26. A voltage that is applied between electrode layers 28 and 30 induces a portion of polymer 26 to deform. Likewise, a voltage that is applied between electrode 24 and electrode 28 induces a portion of polymer 22 to deform. The polymer layers may be actuated simultaneously by applying a voltage between electrode 24 and electrode 28, a second voltage between electrode 28 and electrode 30, with electrode 28 being the common electrode. The use of multiple electroactive polymer layers may increase the force or pressure output of an actuator. For example, ten electroactive polymers may be layered in a similar manner as the two polymer layers illustrated in FIG. 2. An additional layer may also be applied between the stacked polymer layers to promote adhesion.

Polymers of the present invention may also cover a wide range of thicknesses. In one embodiment, polymer thickness may range between about 1 micrometer and 1 millimeter. In one preferred embodiment, the polymer thickness is greater than 5 micrometers and less than 100 micrometers.

Figure 3:
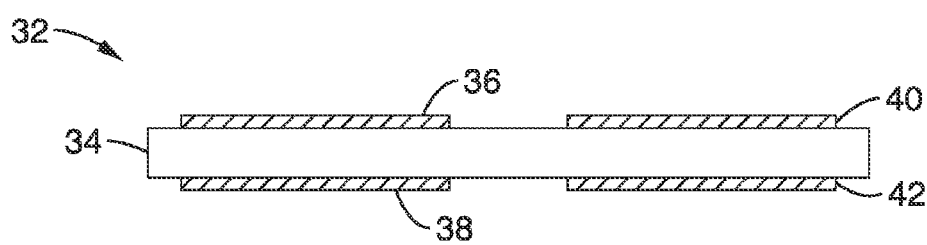
FIG. 3 is a schematic cross sectional view of a transducer consisting of two pairs of compliant electrodes to control two different portions of a bistable electroactive polymer in accordance with one embodiment of the present invention.

Another embodiment of a transducer 32 is shown in FIG. 3. In FIG. 3, the transducer 32 comprises an electroactive polymer 34 and a plurality of electrodes patterned such that a first portion of the polymer deforms in response to a voltage applied between the electrodes. In the embodiment shown in FIG. 3, a voltage is applied between a first electrode pair 36 and 38, and a second portion of the polymer deforms in response to a voltage applied between a second electrode pair 40 and 42. The number of electrode pairs may be further increased as desired and the system scaled to different applications.

Figure 4:
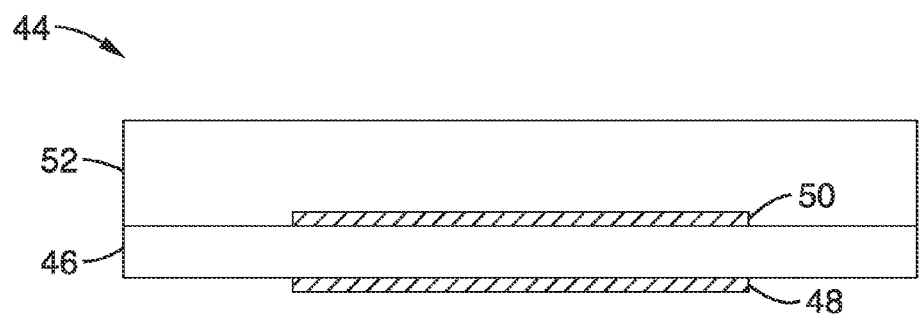
FIG. 4 is a schematic cross sectional view of a transducer including a bistable electroactive polymer and a second soft elastomer in accordance with one embodiment of the present invention.

The embodiment shown in FIG. 4 illustrates a transducer 44 comprising an electroactive polymer 46, an electrode pair 48 and 50, and a second polymer layer 52 conformed on the electroactive polymer 46. The actuated deformation of polymer 46 in response to a voltage applied between electrode 48 and electrode 50 induces the deformation of polymer 52. In one embodiment, the deformation of polymer 52 results in its thickness reduction in one portion and an increase in thickness in another portion.

Figure 5A:
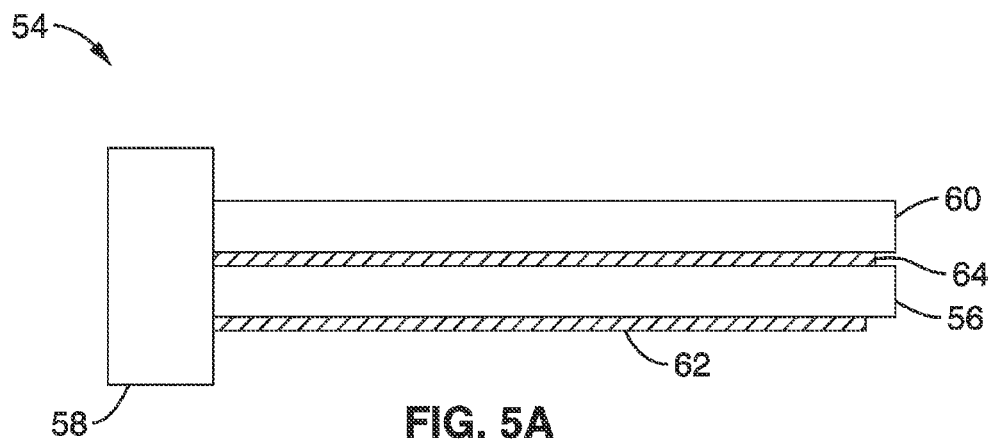
FIG. 5A is a schematic cross sectional view of a unimorph bending beam actuator before the application of a voltage in accordance with one embodiment of the present invention.
Figure 5B:
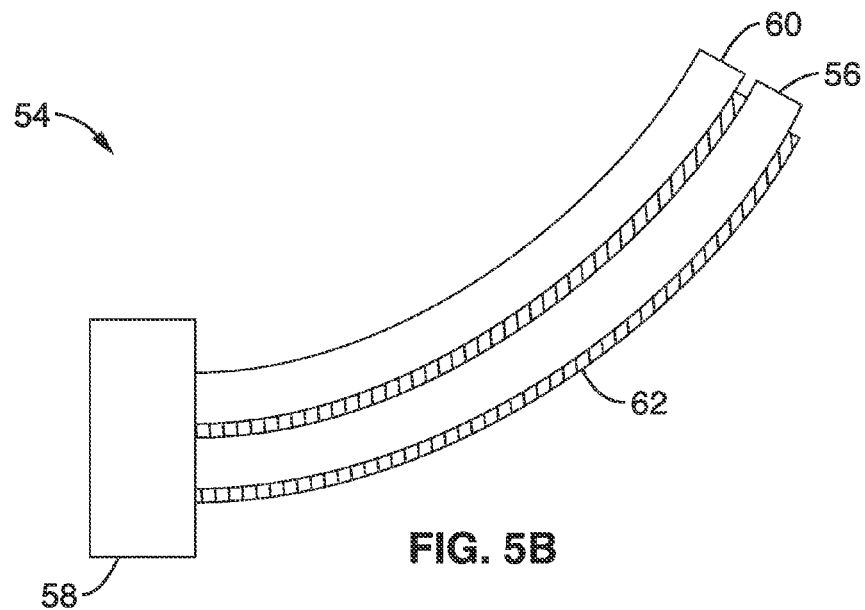
FIG. 5B is a schematic cross sectional view of a unimorph bending beam actuator of FIG. 5A after the application of a voltage in accordance with one embodiment of the present invention.

FIG. 5A and FIG. 5B illustrates a bending beam device 54 for converting between mechanical and electrical energy in accordance with another embodiment of the present invention. The bending beam device 54 includes an electroactive polymer 56 fixed at one end by a rigid support 58 and attached to a flexible thin material 60 such as polyimide or Mylar using an adhesive layer, for example. The flexible thin material 60 preferably has a modulus of elasticity greater than that of the polymer 56. The beam device 54 bends upon actuation. Electrodes 62 and 64 are attached to the opposite sides of the polymer 56 to provide electrical energy. As shown in FIG. 5B, the bending beam device 54 includes a free end having a single bending degree of freedom. Deflection of the free end may be measured by the difference in angle between the free end and the end fixed by the rigid support 58. FIG. 5B illustrates the bending beam device 54 with a bending angle close to 90 degrees.

Figure 6:
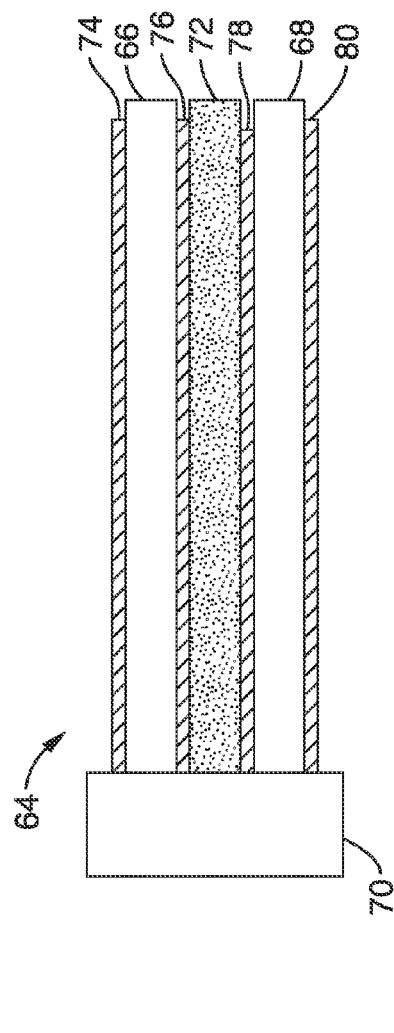
FIG. 6 illustrates a cross-sectional view of a bimorph bending beam actuator in accordance with another embodiment of the present invention.

An alternative design for a bending beam is shown in FIG. 6. The bending beam device 64 for converting between mechanical and electrical energy includes top and bottom polymers 66 and 68 that are fixed at one end by a rigid support 70. A flexible thin material 72 inserted in between polymer layers 66 and 68 may modify the bending angle and/or force of the composite beam. In one embodiment, material 72 is taken out from the laminated structure. Each of the polymer layers 66 and 68 may be independently actuated in the embodiment shown.

Independent actuation is achieved by separate electrical control of top and bottom electrode pairs 74 and 76 and 78 and 80 that are attached to the top and bottom electroactive polymers 66 and 68, respectively. In transducers where the thin material 72 is not used, the electrodes 76 and 78 may be combined as one common electrode situated between the top and bottom electroactive polymer layers 66 and 68 and are attached to both.

Actuating the top electroactive polymer 66 using the top pair of electrodes 74 and 76 causes the bending beam device 64 to bend downward. Similarly, actuation of the bottom polymer 68 using the bottom pair of electrodes 78 and 80 causes the bending beam device 64 to bend upward. Thus, independent use of the top and bottom electroactive polymers 66 and 68 allows the bending beam device 64 to be controlled along a radial direction. When both the top and bottom polymers 66 and 68 are actuated simultaneously, and are of substantially similar size and material, the bending beam device 64 extends in length.

Figure 7:
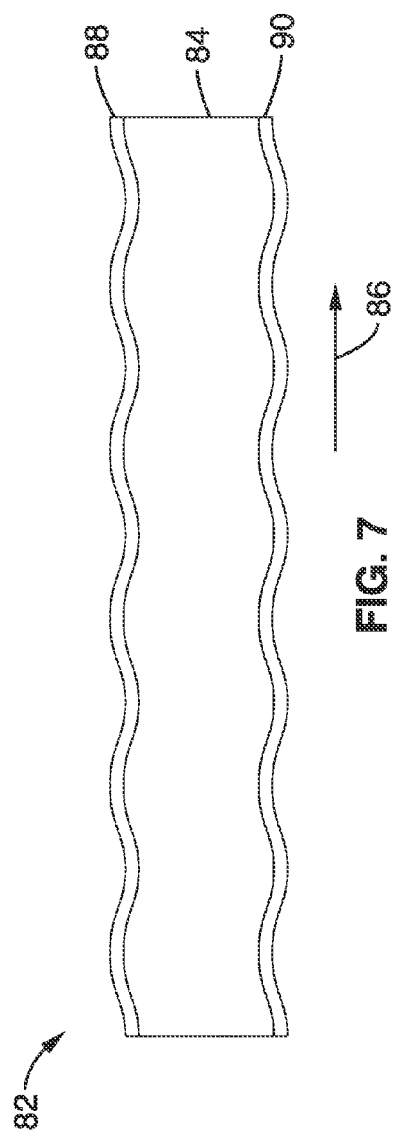
FIG. 7 illustrates a bistable electroactive polymer having a wavelike profile.

Electroactive polymers in accordance with one embodiment of the present invention may include a textured surface. Turning now to FIG. 7 a textured surface for an electroactive polymer 82 having a wavelike profile is shown. The textured surface allows the polymer 84 to deform using bending of surface waves. Bending of the surface waves 84 provides directional compliance in a direction 86 with less resistance than bulk stretching for a stiff electrode attached to the polymer 84. The textured surface of the polymer 84 may be characterized by troughs and crests, for example, about 0.1 micrometer to 40 micrometers wide and about 0.1 micrometers to 20 micrometers deep. In this case, the wave width and depth is substantially less than the thickness of the polymer layer 84. In a specific embodiment, the troughs and crests are approximately 10 micrometers wide and 5 micrometers deep on a polymer layer with a thickness of 50 micrometers. In the embodiment shown in FIG. 7, electrode layers 88 and 90 are formed by conforming on an electroactive polymer 84 with corrugated surfaces. In another specific embodiment, electrodes 88 and 90 are made up of a metal, such as silver, aluminum, nickel, a metal alloy, and the like. The corrugated surfaces of polymer 84 may be formed by embossing, molding, or by lamination.

Transducers may also be provided that include a shape memory polymer and a dielectric elastomer. FIG. 8 illustrates a cross-sectional side view of a transducer 92 in accordance with one embodiment of the present invention. The transducer 92 includes a polymer 94 for translating between electrical energy and mechanical energy. Top and bottom electrodes 96 and 98 are attached to the electroactive polymer 94 on its top and bottom surfaces respectively to provide a voltage difference across a portion of the polymer 94. The polymer 94 deforms with a change in electric field provided by the top and bottom electrodes 96 and 98. As the polymer 94 changes in size, the second polymer layer 100 that conforms on polymer layer 94 is induced to deform. Polymer 94 in accordance with the present invention is a rubbery elastomer in this embodiment. Second polymer 100 is preferably a shape memory polymer being relatively rigid at a temperature below the Tg of polymer 100. Polymer 100 becomes a rubbery elastomer in a certain temperature range above Tg. The transducer 92 includes a laminate of polymers 94 and 100 that may be actuated in a similar manner as the transducer 10 in FIG. 1C. Accordingly, the deformation of transducer 92 may be controlled with temperature and/or applied voltage.

FIG. 9 shows a schematic cross-sectional side view of a transducer 102 in accordance with one embodiment of the present invention. The transducer 102 includes a first polymer 104, a second polymer 106, and a pair of electrodes 108 and 110 for translating between electrical energy and mechanical energy. The polymers 104 and 106 simultaneously deform with a change in electric field provided by the top and bottom electrodes 108 and 110. Polymer 104 in accordance with the present invention is preferably a rubbery elastomer. Polymer 106 is preferably a shape memory polymer being relatively rigid at a temperature below its Tg. Polymer 106 becomes a rubbery elastomer in a certain temperature range above its Tg. The transducer 102 comprises a laminate of polymers 104 and 106 that may be actuated in a similar manner as the transducer 10 in FIG. 1C. Accordingly, the deformation of transducer 102 may be controlled with temperature and/or applied voltage.

Figure 10:
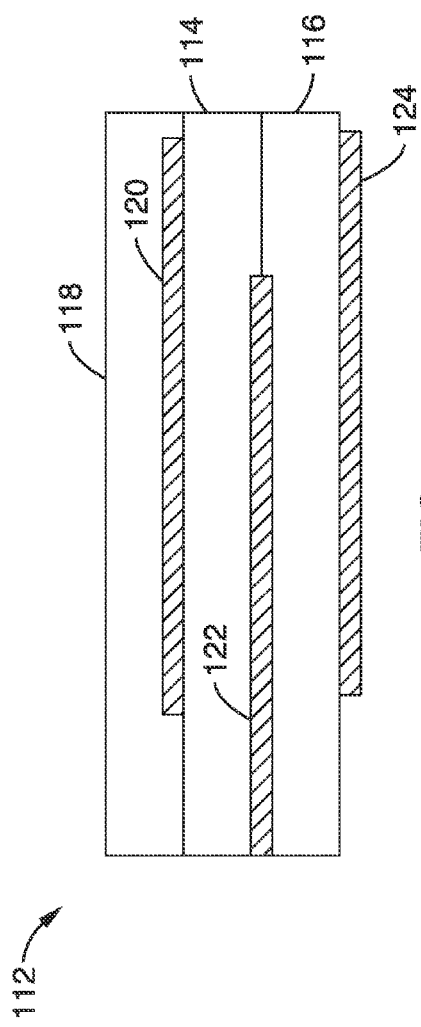
FIG. 10 is a schematic cross sectional view of a transducer including a multilayer stack of a dielectric elastomer and a shape memory polymer in accordance with another alternative embodiment of the present invention.
Figure 11:
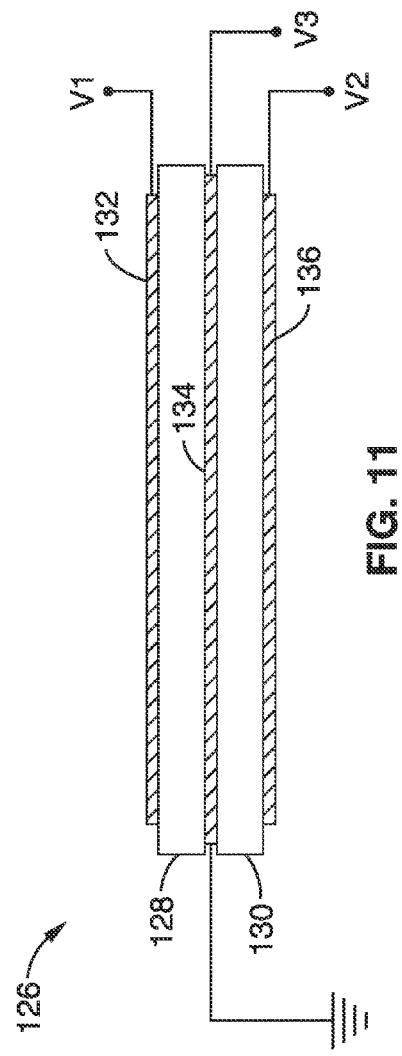
FIG. 11 illustrates a schematic cross sectional view of a transducer including a two-layer stack of a bistable electroactive polymer conforming to each other and includes a central common electrode that provides Joule heating.

To achieve a transducer capable of higher forces, the thickness of the polymer may be increased. Alternatively, multiple polymer layers may be implemented. FIG. 10 describes a transducer 112 has three polymer layers (114 and 116) with top polymer layer 118 and three electrode layers (120, 122, and 124). Polymer layers 114 and 116 in accordance with the present invention are preferably rubbery elastomers with elastic modulus <50 Mpa. Polymer 118 is a shape memory polymer having an elastic modulus >200 MPa at temperatures below its Tg. Polymer 118 becomes a rubbery elastomer with an elastic modulus <50 MPa in a certain temperature range above its Tg.

Transducers of the present invention relate to a shape memory polymer that is electroactive or a combination of a shape memory polymer and an electroactive polymer. The deformation of a shape memory polymer involves heating above the polymer's glass transition temperature. The heating can be accomplished conveniently by a heat source such as an oven, a hot plate, a heat gun. Heating may also be done radiatively using an infrared source, a light source such as sunshine, a laser, a flash light, a mercury lamp, a halogen lamp, a fluorescent tube, or a microwave, etc. Heating may further be done by Joule heating that involving flowing an electrical current through a resistor. The heating may be done using one or more of these heating methods in combination.

In one embodiment of the present invention, Joule heating is administered through a compliant electrode. In the transducers shown in FIG. 1A through FIG. 10, one or more of the applied electrodes may be used additionally as a heating electrode. For example the transducer 126 illustrated in FIG. 11 consists of two polymer layers (128 and 130) and three electrode layers (132, 134, and 136). A voltage applied between electrode 132 and electrode 134 induces a portion of polymer 128 to deform. A voltage applied between electrode 134 and electrode 136 induces a portion of polymer 130 to deform. The polymer layers 128, 130 may be actuated simultaneously by applying a voltage between electrode 132 and electrode 134, a second voltage between 134 and 136, with electrode 134 being the common electrode. For Joule heating, a voltage V3 is applied between two different portions of electrode 134 to cause an electrical current flow between the two portions and consequently the heating of a portion of the electrode. The polymers in close proximity to the heated electrode portion are heated accordingly.

Figure 12:
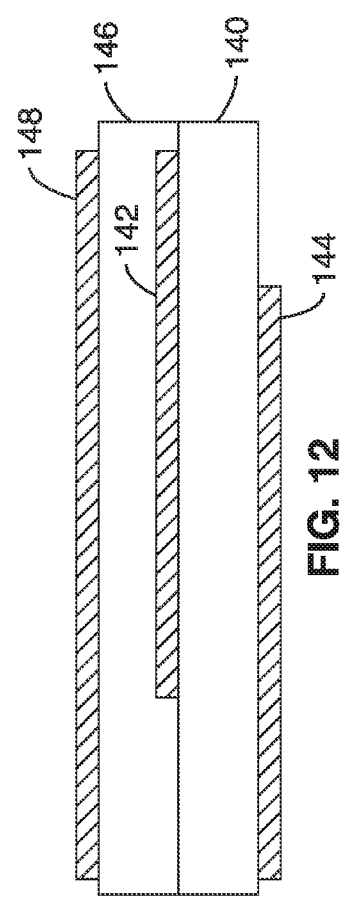
FIG. 12 is a schematic cross sectional view of a transducer having a dielectric elastomer, a shape memory polymer, a pair of electrodes for charge distribution and a Joule heating electrode in accordance with one embodiment of the present invention.

Another embodiment of the Joule heating is illustrated in FIG. 12. There, a transducer 138, in accordance with one embodiment of the present invention, includes a first polymer 140 for translating between electrical energy and mechanical energy. Electrode pair 142 and 144 is attached to the electroactive polymer 140 on its top and bottom surfaces respectively to provide a voltage difference across a portion of the polymer 140. Second polymer 146 is a shape memory polymer. Electrode 148 conforming on 146 provides Joule heating to heat polymer 146 to above its Tg. The Joule heating was obtained by applying a voltage between two different portions of electrode 148.

Figure 13:
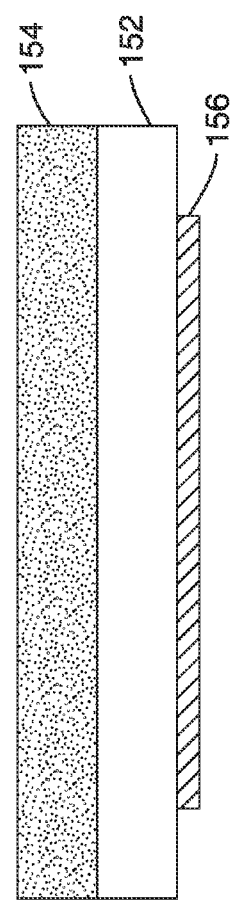
FIG. 13 illustrates a schematic cross sectional view of a transducer including a dielectric elastomer, a conductive shape memory polymer composite in accordance with one embodiment of the present invention.

Referring now to FIG. 13 a transducer 150 including a laminate of a dielectric elastomer 152 for translating between electrical energy and mechanical energy and a conductive shape memory 154 composite is shown. Composite 154 consists of a conductive filler dispersed in a shape memory polymer matrix in this example. Composite 154 is preferably a relatively rigid polymer and may be turned into a rubbery elastomer when an electrical voltage is applied between two portions of the composite to induce a Joule heating. Conductive composite 154 and electrode 156 are attached to the dielectric elastomer 152 on its top and bottom surfaces respectively to provide a voltage difference across a portion of the polymer 152.

As described above, transducers of the present invention preferably include one or more electrodes for actuating an electroactive polymer layer. Generally, electrodes suitable for use with the present invention may be of any shape and material provided they are able to supply or receive a suitable voltage, either constant or varying over time, to or from an electroactive polymer. In one embodiment, the electrodes adhere to a surface of the polymer. Electrodes adhering to the polymer are preferably compliant and conform to the changing shape of the polymer. The electrodes may also be applied to only a portion of an electroactive polymer and define an active area according to their geometry.

In general, the electrodes have a conductance greater than the polymer in order to distribute charge to charge to a dielectric elastomer or shape memory polymer. The non-stringent conductivity requirements of the charge distribution electrodes allow a wide variety of materials to be used. For Joule heating to heat a shape memory polymer, the conductivity is required to be sufficiently high to achieve a fairly uniform heating of the polymer at a relatively low voltage. By way of example, the compliant electrode layer may comprise carbon black, graphite power, graphene, carbon nanotubes, conducting polymer, elastomer with colloidal silver, polymer composite containing conductive fillers. These materials are able to form thin uniform layers with even coverage and have a surface conductivity sufficient to conduct the charge and induce the actuation of a dielectric elastomer and/or a shape memory polymer above its glass transition temperature.

In one embodiment, compliant electrodes of the present invention comprise a conductive grease such as carbon grease or silver grease. The conductive grease provides compliance in multiple directions. Particles may be added to increase the conductivity of the polymer. By way of example, carbon particles may be combined with a polymer binder such as silicone to produce a carbon grease that has low elasticity and high conductivity. Other materials may be blended into the conductive grease to alter one or more material properties. Conductive greases in accordance with the present invention are suitable for deflections of at least about 100 percent strain.

Compliant electrodes of the present invention may also include colloidal suspensions. Colloidal suspensions contain sub-micrometer sized particles, such as graphite, silver and gold, in a liquid vehicle. Generally speaking, any colloidal suspension having sufficient loading of conductive particles may be used as an electrode in accordance with the present invention. In one embodiment, a conductive grease including colloidal sized conductive particles is mixed with a conductive silicone including colloidal sized conductive particles in a silicone binder to produce a colloidal suspension that cures to form a conductive semi-solid. An advantage of colloidal suspensions is that they may be patterned on the surface of a polymer by spraying, dip coating and other techniques that allow for a thin uniform coating of a liquid. To facilitate adhesion between the polymer and an electrode, a binder may be added to the electrode. By way of example, a water-based latex rubber or silicone may be added as a binder to a colloidal suspension including graphite.

In another embodiment, compliant electrodes are achieved using a high aspect ratio conductive material such as carbon fibrils, carbon nanotubes, and metal nanowires. These high aspect ratio carbon materials may form high surface conductivities in thin layers. High aspect ratio carbon materials may impart high conductivity to the surface of the polymer at relatively low electrode thicknesses due to the high interconnectivity of the high aspect ratio carbon materials. By way of example, thicknesses for electrodes made with carbon fibril or carbon nanotube electrodes may be less than 1 micrometer. In one embodiment, single wall carbon nanotube electrodes with a thickness in the range of 20 and 100 nanometers may be used for the charge distribution and/or Joule heating electrodes. The use of polymer binder may be used to increase adhesion with a particular electroactive polymer layer. Alternatively, the use of a dielectric liquid may increase the actuation stability.

It will be seen that the present invention can be used to produce transducers that may be implemented in both the micro and macro scales and finds use in a broad range of applications where electrical energy is converted into mechanical energy. Accordingly, a wide variety of actuator designs are possible. For each specific application, there may be a number of different actuator designs possible. The transducers described in the present invention may be used as actuators. Provided below are several exemplary actuator designs and applications. Generally speaking, electroactive polymers of the present invention may be implemented with a variety of actuators—including conventional actuators retrofitted with an electroactive polymer and custom actuators specially designed for one or more electroactive polymers. Conventional actuators include extenders, bending beams, stacks, diaphragms, etc.

Referring now to FIG. 14, a cross-sectional side view of a diaphragm actuator 158 including an electroactive polymer 160 before actuation in accordance with one embodiment of the present invention is shown. The polymer 160 is attached to a frame 162 in this embodiment. The frame 162 includes a circular hole 164 that allows deflection of the polymer 160 perpendicular to the area of the circular hole 164. The diaphragm actuator 158 also includes circular electrodes 166 and 168 on either side of the polymer 160 to provide a voltage difference across at least a portion of the polymer 160.

In the voltage-off configuration of FIG. 14, the polymer 160 is secured to the frame 162. Upon application of a suitable voltage to the electrodes 166 and 168, the polymer film 160 expands away from the plane of the frame 162 as illustrated in FIG. 15. The electrodes 166 and 168 are compliant and change shape with polymer 160 as it deflects.

The diaphragm actuator 158 is capable of expansion in both directions away from the plane. In one embodiment, the bottom side of the polymer 160 includes a bias pressure that influences the expansion of the polymer film 160 to continually actuate upward in the direction of arrows 170 in FIG. 15.

In another embodiment, a second rubbery polymer is laminated to the bottom side of polymer 160 to influence the expansion of the polymer 160 in the direction of arrows 170. The laminate allows the diaphragm to continually actuate in a desired direction without using a bias pressure. In yet another embodiment, the polymer 160 is embossed or molded to cause slight permanent deflection in one direction as determined during fabrication as shown in FIG. 16. The pre-deflection allows the diaphragm to continually actuate in the deflected direction 170 without using a bias pressure.

The amount of expansion for the diaphragm actuator 158 will vary based on a number of factors including the physical characteristics of the polymer 160 material, the applied voltage, any bias pressure, compliance of the electrodes 166 and 168, etc. In one embodiment, the polymer 160 is capable of deflections to a height of at least about 50 percent of the hole diameter and may take a hemispheric shape at large deflections. In this case, an angle 172 formed between the polymer 160 and the frame 162 may be less than 90 degrees.

Electroactive polymers, either individually or mechanically linked in a collection, may be referred to as artificial muscle. The term artificial muscle in itself implies that these actuators are well-suited for application to biologically inspired robots or biomedical applications where the duplication of muscle, mammalian or other, is desired. By way of example, applications such as prosthetic limbs, exoskeletons, and artificial sphincters may benefit from the electroactive polymers of the present invention. The size scalability of electroactive polymers and the ability to use any number of transducers or polymer actuators in a collection allow artificial muscle in accordance with the present invention to be used in a range in applications greater than their biological counterparts. As transducers and actuators of the present invention have a performance range outside their biological counterparts, the present invention is not limited to artificial muscle having a performance corresponding to real muscle, and may indeed include applications requiring performance outside that of real muscle.

The electroactive polymers may also range in thickness from several micrometers to several millimeters and preferably from several micrometers to hundreds of micrometers. Micro bistable electroactive polymers are well-suited for applications such as actuated valves, inchworm-type actuators, pointing mirrors, microclamps, and micro robotic applications. Micro robotic applications may include micro robot legs, grippers, pointer actuators for CCD cameras, wire feeders for micro welding and repair, and clamping actuators to hold rigid positions. In another application, a diaphragm actuator may be implemented in an array of similar electroactive polymer diaphragms in a planar configuration on a single surface.

Figure 17A:
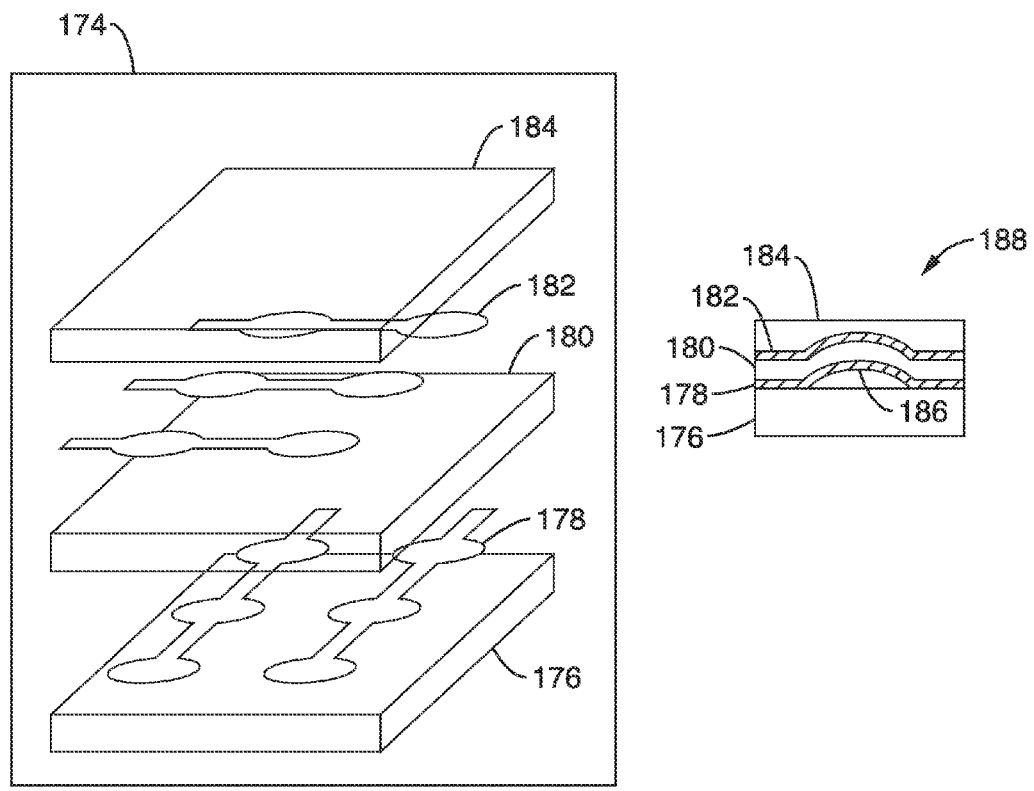
FIG. 17A illustrates a schematic composite and expanded side view of an array of 2×3 diaphragms including a bistable electroactive polymer before application of a voltage in accordance with one embodiment of the present invention.
Figure 17B:
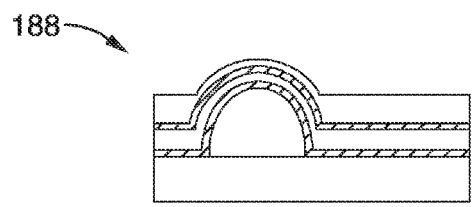
FIG. 17B illustrates a schematic cross sectional view of a raised diaphragm of the diaphragm array shown in FIG. 17A after application of a voltage.

By way of example, an array may include six diaphragms 188 with the diameter of 1.5 millimeters each arranged in a planar configuration as shown in FIG. 17A. The laminate array 174, or a Braille cell, includes a substrate 176, a bottom patterned compliant electrode 178, a bistable electroactive polymer 180, a top patterned electrode 182, and a top soft elastomer 184, all conformed in laminated configuration except for in the six circular areas 186. In each of the 6 circular areas 186, the top electrode 182 and bottom electrode 178 overlaps to define an actuation area. In the circular area 186, the elastomer layer 184, the electrodes 182, the polymer layers 180, and 168 adhere onto each other and are not adhered with the portion of substrate 166 in the circular area 186. At rest, array 174 has a relatively flat surface in elastomer layer 184 as seen in FIG. 17A. When the bistable electroactive polymer 180 is actuated, the layers of 184, 182, 180, and 178 in the circular area 186 deflect upward to cause a raised height in the area 186 as seen in FIG. 17B. A mechanical bias such a pneumatic pressure, a hydraulic pressure, a compressed spring, or compressed foam may be used to cause the upward deflection when actuated. Alternatively, one or more of the polymers in the area 186 may be pre-deflected, obtained in fabrication by embossing or molding, to cause the upward deflection when actuated.

The six diaphragms 188 have a relatively flat surface when they are turned OFF. The individual diaphragms 188 may be independently actuated to form patterns of raised dots to display Braille characters, e.g., alphabets, numbers, and symbols. Alternatively, a Braille cell may consist of 8 diaphragms to form up to 8 raised dots.

Figure 18:
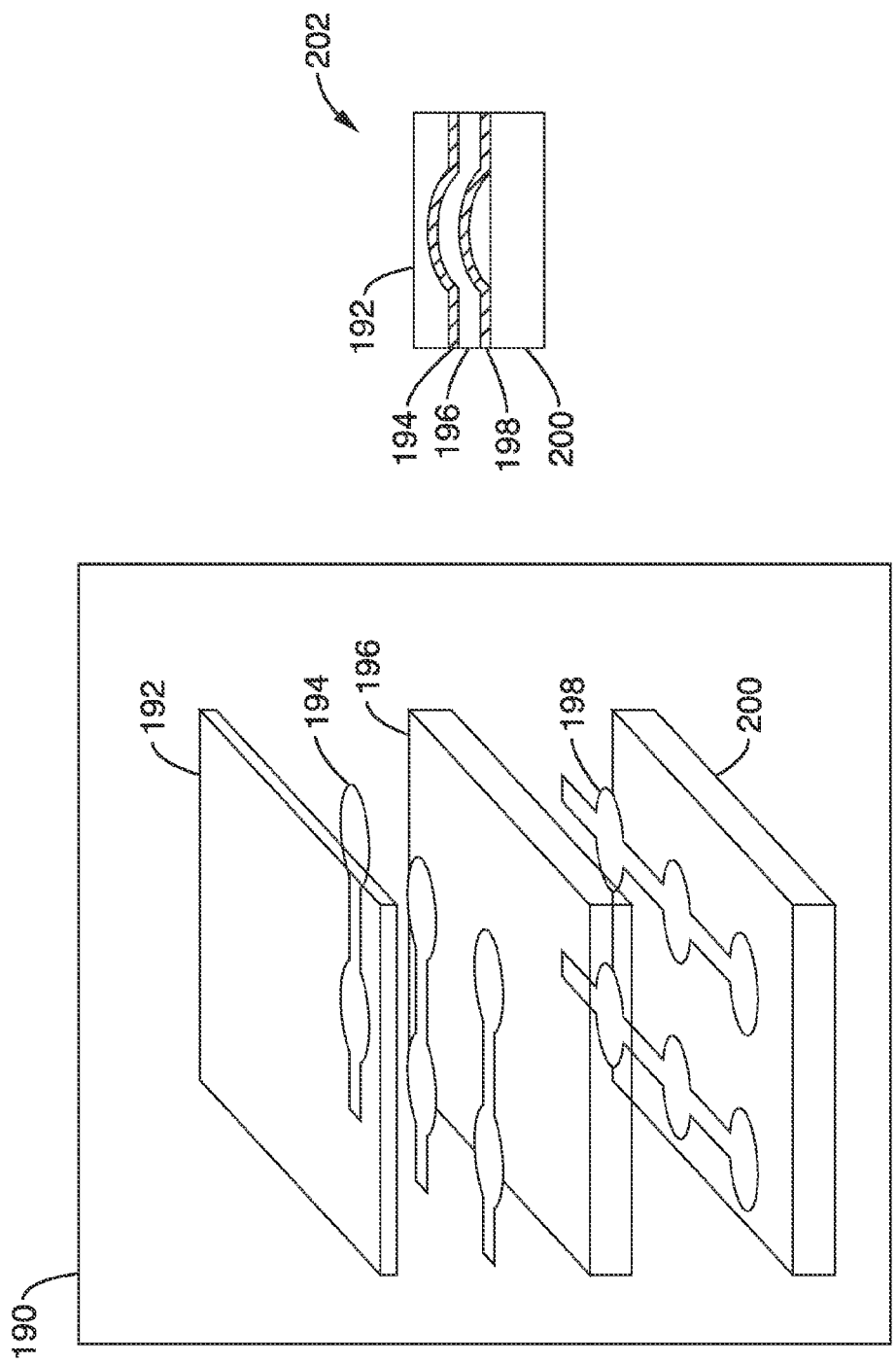
FIG. 18 illustrates a composite and expanded view of a schematic array of 2×3 diaphragms including a pre-deflected shape memory polymer and a dielectric elastomer conforming to each other in accordance with one embodiment of the present invention.

In another embodiment of the present invention illustrated in FIG. 18, a Braille cell array 190 includes a shape memory polymer 192, a top patterned electrode 194, a dielectric elastomer 196, a bottom patterned electrode 198, and a substrate 200. Each diaphragm 202 of the cell 190 has circular deflectable area as illustrated in FIG. 18. In the specific embodiment illustrated in FIG. 18, in each of the circular deflectable areas the substrate 200 has a slightly raised surface formed in fabrication of the substrate 200 as shown in the diaphragm 202 cross-section of FIG. 18. The layers of 192, 194, 196, and 198 above the raised substrate surface are slightly deflected upward.

Figure 19B:
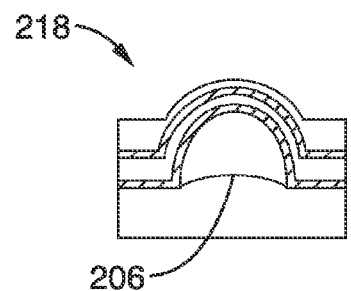

Referring also to FIG. 19A and FIG. 19B, a composite and expanded view of a schematic array of 2×3 diaphragms including a shape memory polymer, a dielectric elastomer, and a substrate with raised height on portions of the substrate surface is shown in FIG. 19A. FIG. 19B illustrates one raised diaphragm 218 of the diaphragm array 204 in FIG. 19A after the application of a voltage. As seen in FIG. 19A, the Braille cell array 204 has arcuate raised sections 206 on substrate 208. Electrode 210 and electrode 212 are on opposite sides of polymer 214 and shape memory polymer 216. The slight deflection upward is supported by the raised substrate surface 206, however the adhesion is relatively weak between the bottom surface of electrode 210 and the raised substrate surface 206 in the circular area. When the dielectric elastomer 214 is actuated, the layers of 216, 212, 214 and 210 above the raised substrate surface deflect further upward to cause a raised "dot" on the surface of the diaphragm 218 as shown on FIG. 19B.

The actuation of diaphragms may use a similar temperature and voltage control as illustrated in FIG. 1C. When a dot is raised upon heating and voltage application, it is allowed to cool below the polymer's Tg while the voltage is kept on. At the cooled state, the polymer is rigid and retains it raised height after the actuation voltage is removed. The raised dot may be returned to the original, relatively flat shape after it is heated to above Tg to allow it to recover its flat, relaxed shape. The flat shape is retailed after the polymer is allowed to cool below its Tg. Accordingly, a diaphragm of the present invention may be actuated to various stable raised heights.

In one embodiment, a diaphragm array is configured to display a fraction of a page, or a full page of Braille text. In one specific embodiment, a diaphragm array is configured to display one line of Braille text, e.g. 30 characters. In another specific embodiment, a diaphragm array is configured to display 20×30 Braille characters. The actuators may be used to fabricate a refreshable Braille display for people with vision impairment. The display device can display one-page of Braille text at a time, and can be quickly refreshed with the push of a button. The display device may be equipped with WiFi and USB ports for internet access, text messaging, printer connection, file loading and storage.

A diaphragm array of the present invention may be configured to form bistable patterns of raised dots for general tactile displays, topological change of a surface, or graphics displays. It will be seen that dots of any size can be formed.

In another embodiment, a transducer of the present invention is used as an optical modulation device or an optical switch. The transducer includes an electrode whose opacity varies with deflection. A transparent or substantially translucent bistable electroactive polymer is attached to the opacity varying electrode and deflection of the polymer is used to modulate opacity of device. FIG. 20 illustrates a schematic cross-sectional side view of a transducer including a bistable electroactive polymer having a portion of the polymer with variable optical transmission.

For example in the embodiment illustrated in FIG. 20, the actuator 220 includes one or more electrode pairs (222 and 224) and (226 and 228) conformed on portions of a bistable electroactive polymer 230. Actuation of the portions of polymer 230 causes the deformation in another portion (232) of the polymer 230 that does not have electrodes conformed on the surfaces. Optical transmission of the portion 232 is modulated by the actuation of other portions of the polymer 230. In one embodiment, the portion 232 of polymer 230 is transparent. The thickness change in 232 modulates the phase angle of the transmitting light. In another embodiment, the portion 232 is semitransparent to light of certain wavelengths. The actuated thickness change in 232 modulates the transparency of the light in the certain wavelengths. The transparency of the polymer 230 to a specific wavelength may be modified by impregnation with a dye or a pigment, by coating with a second material with a desirable color.

FIG. 21 illustrates a schematic cross-sectional side view of a transducer including a bistable electroactive polymer and an optical diffraction grating. In FIG. 21, an optical modulator 234 includes one or more electrode pairs (236 and 238, 240 and 242) conforming on portions of a bistable electroactive polymer 244, and a layer of soft elastic optical grating 246 conforming on another portion of polymer 244. Actuation of the transducer 234 would change the grating period of the soft diffraction grating. Transducer 234 may be applied for interferometry, spectroscopy, high resolution microscopy, communication devices, and bistable optical displays.

FIG. 22 illustrates a schematic cross-sectional side view of a transducer including a shape memory polymer, a dielectric elastomer, and an optical diffraction grating. The embodiment shown in FIG. 22 has an optical modulator 248 including one or more electrode pairs (250 and 252, 254 and 256), a dielectric elastomer 258, a shape memory polymer 260, and a layer of soft elastic optical grating 262. Actuation of polymer 258 in response to voltage applied to one or more electrode pairs would change the grating period of the soft diffraction grating. Transducer 248 may be applied for interferometry, spectroscopy, high resolution microscopy, communication devices, and bistable optical displays.

In order to demonstrate the functionality of the structures and methods, a The invention may be better understood with reference to the accompanying examples, which are intended for purposes of illustration only and should not be construed as in any sense limiting the scope of the present invention as defined in the claims appended hereto.

EXAMPLE 1

In order to demonstrate the functionality of the structures and methods, a bistable electroactive polymer was produced with 0.5 grams of photoinitiator dissolved in 100 g tertbutyl acrylate. The mixture was polymerized under UV irradiation (100 W UV lamp, 15 cm distance) for 10 minutes to produce a clear and rigid solid product of poly tertbutyl acrylate. Poly tertbutyl acrylate films were obtained first by casting its toluene solution (~5 wt %) onto a cleaned and leveled glass substrate. The film was left to stand until the solvent was fully dried. The film was then put into 70° C. oven and annealed for 12 hrs. The polymer film was soaked into deionized water for 1 hour and peeled off from the glass substrate. The peeled off film was dried at room temperature in a vacuum oven for 24 hours.

Thermal annealing was found to be desirable to enhance the mechanical strength of the polymer films. The film was very soft without thermal treatment. It was also found the thermal annealing increased the crystalline structure inside the polymer as compared from the XRD results of two samples: Sample 1 was stored at room temperature for 1 week; and Sample 2 was heat treated for 12 hours at 70° C. The XRD spectrum of both samples were obtained and evaluated.

The prepared poly tertbutyl-acrylate film was biaxially stretched by 100%*100% at 75° C. and attached to a frame fixture. The final film thickness was measured as around 30 μm. Top and bottom electrodes were either smeared with carbon grease or sprayed with SWNT under shadow masks. Devices were tested in 75° C. oven.

The sample with carbon grease electrodes in the 75° C. oven with an applied voltage of 3 KV on the sample produced ~140% area strain. The sample with SWNT electrodes at room temperature was observed to have ~110% area strain after being actuated at 75° C.

EXAMPLE 2

Another demonstration of the functionality and application of bistable electroactive polymers (BSEP), Poly (tert-butylacrylate)(PTBA), a rigid thermoplastic at ambient conditions, was synthesized through UV initiated free-radical polymerization. The resulting polymer had an average molecular weight Mn of 120 000 daltons and polydispersity of 4.2, determined by gel permeation chromatography using a poly(methyl methacrylate) standard. Thin films were casted from solutions of PTBA in toluene followed by annealing at 70° C. for 12 hours. The annealed PTBA has a storage modulus of 1.5 GPa, a loss factor tan δ of 0.03 at 30° C. At 70° C., the storage modulus is 0.42 MPa with a loss factor tan δ of 0.8.

Diaphragm actuators were fabricated using 30 μm thick PTBA films. Conductive carbon grease was used to form the compliant electrodes. The PTBA film was placed on a diaphragm chamber. A rigid plastic frame was placed on top of the polymer film to define the circular active area with a 4.5 cm diameter. A small positive pneumatic pressure was applied to the diaphragm to prevent the actuated films from wrinkling. The actuation was carried out in an environmental chamber to control the temperature. When the diaphragm actuator was heated to 70° C., no deformation was observed on the PTBA film.

An actuation voltage of 1.8 kV was then applied between the top and bottom electrodes and the active area expanded into a dome shape. Area strain was calculated from geometric relations found between the diameter and height of the convex dome. The actuation strain was observed to be dependent on the applied electric field across the PTBA film. The actuation strain initially increased quadratically with applied electrical field as predicted by Maxwell force. The strain levels off at high electrical field, which is likely the result of an increase in elastic modulus at high strains. The maximum measured strain was 335% (area expansion) at 260 MV/m. The corresponding thickness strain was ~77%. The dielectric constant of the PTBA was 5.4 measured at 70° C. at 200 Hz ac. Thus, the calculated maximum actuation stress is 3.2 MPa, and the maximum energy density is 1.2 J/cm$^3$. Both values are comparable with those reported for dielectric elastomer EAP's and are significantly higher than the muscle.

The actuated deformation was reversible and repeatable. Cyclic tests were performed with the electric fields alternated between 0 and 120 MV/m (170% area strain) for hundreds of cycles without mechanical or dielectric breakdown. When the deformed films were cooled to 22° C. and the actuation voltage was subsequently turned off, the deformed films regained their rigidity. The actuated deformations were locked in. The strain fixity was 100% within the accuracy limit of the measurement. No shrinkage was observed at ambient conditions for 9 months. When the deformed films were reheated to 70° C., they immediately returned to their original shapes.

EXAMPLE 3

To demonstrate the application of the bistable electroactive polymers to embossing, poly(tert-butyl acrylate) was cut into small pieces and dissolved in toluene to prepare a solution containing 20% by weight of the polymer. The solution was poured onto a sheet glass with a cleaned surface. After the solvent was evaporated in air, the polymer film coated on the glass was soaked in DI water to peel the film off of the glass. The dried film had a thickness of 340 μm. The film was then pre-stretched biaxially to a final thickness of 50 μm while it was heated at 80° C. For embossing, a plexiglass plate was drilled with φ2 (mm diameter) to create surface dimples. A steel ball of φ2 and φ1.5 was placed in each dimple. The resulting structure, the embossing mold, was cleaned with acetone. The pre-stretched poly(tert-butyl acrylate) film was laminated on the mold at 80° C. Then a 250 μm thick silicone elastomer film, a VHB 4910 adhesive tape, and an aluminum plate were successively placed on top of the polymer film. A load was applied on the plates. The entire structure was heated at 80° C. for 24 hours. The structure was cooled down to room temperature, and the embossed polymer film was separated from the mold.

A transducer was fabricated using the embossed poly(tert butyl acrylate). Single wall carbon nanotubes dispersed in chloroform was sprayed onto the polymer film. Contact masks were used such that the nanotubes were sprayed on both surfaces of the embossed portions of the film. A Kapton™ tape with pre-drilled through-holes was taped onto the polymer film in a manner that the holes and the embossed portions were aligned with each other. For the actuation test, the laminated films were placed in a oven heated at 70° C. A voltage of 3 kV was applied between the opposite nanotube electrodes, the embossed portion of the polymer film was found to deform, forming a larger curvature.

EXAMPLE 4

The application of the bistable electroactive polymers for an active Braille display was also demonstrated. A six-dot diaphragm actuator, similar to those shown in FIG. 17-19 was constructed based on a 30 μm thick PTBA film. The top surface of the film was coated with a thin layer of single wall carbon nanotube (SWNT) by spraying. The bottom surface of the film was taped to a Kapton™ film with six openings arrayed in a Braille cell pattern. Conductive carbon grease was smeared into the uncovered circular areas. The film was then attached onto a diaphragm chamber.

A 2.5 mA ac current from a 20 V and 60 Hz power source was applied through the top SWNT electrode to heat the polymer film. The temperature in the film was monitored with an infrared thermometer. It took about 20 seconds for the temperature to reach 70° C.

For electrostatic actuation, a 1.3 kV dc was applied between the top SWNT coating and the bottom carbon grease electrodes. The actuated deformation of the dots was locked in shape after disconnecting the heating current and then the actuation voltage.

The side view of one of the Braille dots showed a half-dome shape with a height of 0.75 mm above the flat surface, indicating a 100% area strain. The domes flattened out after the heating current was reapplied to warm the polymer to 70° C.

Generally, the preferred characteristics for the Braille displays include a displacement of greater than approximately 0.5 mm, a supporting force greater than approximately 0.1-0.5 N, a response time less than approximately 100 ms, and driving voltage less than approximately 1000 Volts.

To examine the supporting force of the Braille dots based on the BSEP films, a 0.6 N force was applied vertically on the top of the domes. The dome shape was not altered. The height of the dome was reduced by 0.1 mm, due to curving down of the polymer film at the base of the dome. The response speed in the BSEP actuators was determined by the heating and cooling in each cycle and is typically around 40 seconds. This can be potentially reduced when the heating and thermal dissipation are optimized. The bistability also alleviates the requirement on response speed. The lines in a Braille page can be successively refreshed after they have been read. This scheme also avoids direct finger contact while a cell is being refreshed (actuated).

From the discussion above it will be appreciated that the invention can be embodied in various ways, including the following:

1. A bistable transducer, comprising: a plurality of polymer members; and at least two electrodes joined to said polymer members configured to produce an electric field; wherein said polymer softens with an increase in temperature and deforms in response to a change in an applied electric field between the electrodes; and wherein said polymer member retains a deformed shape with a reduction in temperature below a transition temperature.

2. A transducer according to embodiment 1, wherein said polymer members have an elastic modulus greater than greater than 100 MPa at ambient temperature that is reduced to less than 50 MPa when the temperature is raised above a transition temperature.

3. A transducer according to embodiment 1, wherein said polymer members have an elastic modulus greater than greater than 500 MPa at ambient temperature that is reduced to less than 100 MPa when the temperature is raised above a transition temperature.

4. A transducer according to embodiment 3, wherein said transition temperature of said polymer is above approximately 50° C.

5. A transducer according to embodiment 1, further comprising a heating element operably coupled to said polymer members and configured to heat said polymer members to a temperature above a transition temperature for said polymer.

6. A transducer according to embodiment 5, wherein said heating element comprises: a source of electromagnetic radiation; and a radiation absorber associated with said polymer; wherein said radiation is absorbed by the absorber raising the temperature of said polymer to above a transition temperature.

7. A transducer according to embodiment 5, wherein said radiation absorber is selected from the group of absorbers consisting essentially of an infrared radiation absorbing film, a colorant in the polymer member, a light absorbing film and a radiation absorbing electrode.

8. A transducer according to embodiment 1, wherein said polymer is a thermoplastic polymer.

9. A transducer according to embodiment 1, wherein said polymer is poly(tert-butyl acrylate).

10. A transducer according to embodiment 1, wherein said polymer is a crosslinked polymer.

11. A transducer according to embodiment 10, wherein said crosslinked polymer is a polymer containing repeating units of tert-butyl acrylate.

12. A transducer according to embodiment 1, wherein said polymer comprises a polymer blend containing at least a crosslinked polymer.

13. A transducer according to embodiment 12, wherein said polymer comprises a polymer blend containing at least a first crosslinked polymer and a second crosslinked polymer that interpenetrates into the first crosslinked polymer.

14. A transducer according to embodiment 12, wherein said polymer comprises a polymer blend containing at least a crosslinked polymer and a thermoplastic polymer that interpenetrates into the crosslinked polymer.

15. A transducer according to embodiment 1, wherein said polymer comprises a polymer composite containing at least one additive selected from the group of additives consisting of nanoparticles, nanowires, nanorods, plasticizers, surfactants, light absorbing agent, light absorbing fillers, conductive fillers, microwave absorbing fillers, and magnetic fillers.

16. A transducer according to embodiment 1: wherein at least one electrode portion in contact with a portion of a polymer member is compliant; and wherein the compliant electrode portion deforms with the polymer member and is capable of deformation with a maximum linear strain of at least approximately 10 percent.

17. A transducer according to embodiment 16, wherein the electrode portion is compliant in one direction greater than in a second direction.

18. A transducer according to embodiment 16, wherein said polymer members are substantially translucent and said compliant electrodes vary in opacity with the deformation of the polymer member.

19. A transducer according to embodiment 1, wherein the electrodes are formed from a material selected from the group of materials consisting of a high aspect ratio carbon material, a fine carbon powder, a conductive polymer, a carbon fibril, and a carbon nanotube material.

20. A transducer according to embodiment 16, wherein the compliant portion of said electrode has a thickness less than about 1 micrometers.

21. A transducer according to embodiment 16, wherein the compliant portion of said electrode has a thickness less than about 100 nanometers.

22. A transducer according to embodiment 1: wherein at least one electrode portion in contact with a portion of a polymer member is compliant; and wherein the compliant electrode portion deforms with the polymer member and is capable of deformation with a maximum linear strain of at least approximately 50 percent.

23. A transducer according to embodiment 1, further comprising: a plurality of rigid elements joined to said polymer elements; wherein the position of said rigid elements is changed with the deformation of said polymer by said electric fields.

24. A transducer according to embodiment 23, wherein at least one of said rigid elements is exposed to an applied strain prior to deformation of said polymer.

25. A transducer according to embodiment 23, wherein said polymer members are exposed to an applied strain prior to deformation of said polymer.

26. A transducer according to embodiment 1, further comprising an optical diffraction grating disposed on said polymer member.

27. A bistable transducer, comprising: a plurality of polymer members; at least two electrodes joined to said polymer members configured to produce an electric field; and means for raising the temperature of said polymer members; wherein said polymer softens with an increase in temperature and deforms in response to a change in an applied electric field between the electrodes; and wherein said polymer member retains a deformed shape with a reduction in temperature below a transition temperature.

28. A transducer according to embodiment 27, wherein said means for raising the temperature of said polymer is a heating element selected from the group heating elements consisting essentially of patterned laser light, a resistance heating element, a radiation source with a radiation absorbing film, and a light source with a polymer colorant.

29. A transducer according to embodiment 27, further comprising: a plurality of rigid elements joined to said polymer elements; wherein the position of said rigid elements is changed with the deformation of said polymer by said electric fields.

30. A transducer according to embodiment 27, wherein said polymer members and said electrodes are substantially translucent.

31. A transducer according to embodiment 20, further comprising an optical diffraction grating disposed on said polymer member.

32. A bistable transducer, comprising: a plurality of polymer members; at least two electrodes joined to said polymer members configured to produce an electric field; means for raising the temperature of said polymer members; and means for pre-straining said polymer members; wherein said polymer softens with an increase in temperature and deforms in response to a change in an applied electric field between the electrodes; and wherein said polymer member retains a deformed shape with a reduction in temperature below a transition temperature.

33. A transducer according to embodiment 32, wherein said means for raising the temperature of said polymer is a heating element selected from the group heating elements consisting essentially of patterned laser light, a resistance heating element, a radiation source with a radiation absorbing film, and a light source with a polymer colorant.

34. A transducer according to embodiment 32, wherein said means for pre-straining said polymer is selected from the group consisting essentially of a spring in compression, a pneumatic pressure, a hydraulic pressure, and a foam in compression.

35. A transducer according to embodiment 32, further comprising: a plurality of rigid elements joined to said polymer elements; wherein the position of said rigid elements is changed with the deformation of said polymer by said electric fields.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A bistable transducer, comprising:
a plurality of polymer members; and
at least two electrodes joined to said polymer members configured to produce an electric field;
wherein said polymer softens with an increase in temperature and deforms in response to a change in an applied electric field between the electrodes; and
wherein said polymer member retains a deformed shape with a reduction in temperature below a transition temperature.

2. A transducer as recited in claim 1, wherein said polymer members have an elastic modulus greater than greater than 100 MPa at ambient temperature that is reduced to less than 50 MPa when the temperature is raised above a transition temperature.

3. A transducer as recited in claim 1, wherein said polymer members have an elastic modulus greater than greater than 500 MPa at ambient temperature that is reduced to less than 100 MPa when the temperature is raised above a transition temperature.

4. A transducer as recited in claim 3, wherein said transition temperature of said polymer is above approximately 50° C.

5. A transducer as recited in claim 1, further comprising a heating element operably coupled to said polymer members and configured to heat said polymer members to a temperature above a transition temperature for said polymer.

6. A transducer as recited in claim 5, wherein said heating element comprises:
a source of electromagnetic radiation; and
a radiation absorber associated with said polymer;
wherein said radiation is absorbed by the absorber raising the temperature of said polymer to above a transition temperature.

7. A transducer as recited in claim 5, wherein said radiation absorber is selected from the group of absorbers consisting essentially of an infrared radiation absorbing film, a colorant in the polymer member, a light absorbing film and a radiation absorbing electrode.

8. A transducer as recited in claim 1, wherein said polymer is a thermoplastic polymer.

9. A transducer as recited in claim 1, wherein said polymer is poly(tert-butyl acrylate).

10. A transducer as recited in claim 1, wherein said polymer is a crosslinked polymer.

11. A transducer as recited in claim 10, wherein said crosslinked polymer is a polymer containing repeating units of tert-butyl acrylate.

12. A transducer as recited in claim 1, wherein said polymer comprises a polymer blend containing at least a crosslinked polymer.

13. A transducer as recited in claim 12, wherein said polymer comprises a polymer blend containing at least a first crosslinked polymer and a second crosslinked polymer that interpenetrates into the first crosslinked polymer.

14. A transducer as recited in claim 12, wherein said polymer comprises a polymer blend containing at least a crosslinked polymer and a thermoplastic polymer that interpenetrates into the crosslinked polymer.

15. A transducer as recited in claim 1, wherein said polymer comprises a polymer composite containing at least one additive selected from the group of additives consisting of nanoparticles, nanowires, nanorods, plasticizers, surfactants, light absorbing agent, light absorbing fillers, conductive fillers, microwave absorbing fillers, and magnetic fillers.

16. A transducer as recited in claim 1:
wherein at least one electrode portion in contact with a portion of a polymer member is compliant; and
wherein the compliant electrode portion deforms with the polymer member and is capable of deformation with a maximum linear strain of at least approximately 10 percent.

17. A transducer as recited in claim 16, wherein the electrode portion is compliant in one direction greater than in a second direction.

18. A transducer as recited in claim 16, wherein said polymer members are substantially translucent and said compliant electrodes vary in opacity with the deformation of the polymer member.

19. A transducer as recited in claim 1, wherein the electrodes are formed from a material selected from the group of materials consisting of a high aspect ratio carbon material, a fine carbon powder, a conductive polymer, a carbon fibril, and a carbon nanotube material.

20. A transducer as recited in claim 16, wherein the compliant portion of said electrode has a thickness less than about 1 micrometers.

21. A transducer as recited in claim 16, wherein the compliant portion of said electrode has a thickness less than about 100 nanometers.

22. A transducer as recited in claim 1:
wherein at least one electrode portion in contact with a portion of a polymer member is compliant; and
wherein the compliant electrode portion deforms with the polymer member and is capable of deformation with a maximum linear strain of at least approximately 50 percent.

23. A transducer as recited in claim 1, further comprising:
a plurality of rigid elements joined to said polymer elements;
wherein the position of said rigid elements is changed with the deformation of said polymer by said electric fields.

24. A transducer as recited in claim 23, wherein at least one of said rigid elements is exposed to an applied strain prior to deformation of said polymer.

25. A transducer as recited in claim 23, wherein said polymer members are exposed to an applied strain prior to deformation of said polymer.

26. A transducer as recited in claim 1, further comprising an optical diffraction grating disposed on said polymer member.

27. A transducer as recited in claim 20, further comprising an optical diffraction grating disposed on said polymer member.

28. A bistable transducer, comprising:
a plurality of polymer members;
at least two electrodes joined to said polymer members configured to produce an electric field; and
means for raising the temperature of said polymer members;
wherein said polymer softens with an increase in temperature and deforms in response to a change in an applied electric field between the electrodes; and
wherein said polymer member retains a deformed shape with a reduction in temperature below a transition temperature.

29. A transducer as recited in claim 28, wherein said means for raising the temperature of said polymer is a heating element selected from the group heating elements consisting essentially of patterned laser light, a resistance heating element, a radiation source with a radiation absorbing film, and a light source with a polymer colorant.

30. A transducer as recited in claim 28, further comprising:
a plurality of rigid elements joined to said polymer elements;
wherein the position of said rigid elements is changed with the deformation of said polymer by said electric fields.

31. A transducer as recited in claim 28, wherein said polymer members and said electrodes are substantially translucent.

32. A bistable transducer, comprising:
a plurality of polymer members;
at least two electrodes joined to said polymer members configured to produce an electric field;
means for raising the temperature of said polymer members; and
means for pre-straining said polymer members;
wherein said polymer softens with an increase in temperature and deforms in response to a change in an applied electric field between the electrodes; and
wherein said polymer member retains a deformed shape with a reduction in temperature below a transition temperature.

33. A transducer as recited in claim 32, wherein said means for raising the temperature of said polymer is a heating element selected from the group heating elements consisting essentially of patterned laser light, a resistance heating element, a radiation source with a radiation absorbing film, and a light source with a polymer colorant.

34. A transducer as recited in claim 32, wherein said means for pre-straining said polymer is selected from the group consisting essentially of a spring in compression, a pneumatic pressure, a hydraulic pressure, and a foam in compression.

35. A transducer as recited in claim 32, further comprising:
a plurality of rigid elements joined to said polymer elements;
wherein the position of said rigid elements is changed with the deformation of said polymer by said electric fields.

* * * * *